(12) United States Patent
Ema

(10) Patent No.: US 6,927,100 B2
(45) Date of Patent: Aug. 9, 2005

(54) METHOD OF FABRICATING SEMICONDUCTOR DEVICE HAVING BLOCKING LAYER AND FUSE

(75) Inventor: Taiji Ema, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 384 days.

(21) Appl. No.: 09/984,775

(22) Filed: Oct. 31, 2001

(65) Prior Publication Data

US 2002/0028539 A1 Mar. 7, 2002

Related U.S. Application Data

(62) Division of application No. 09/256,081, filed on Feb. 24, 1999, now Pat. No. 6,333,545.

(30) Foreign Application Priority Data

Aug. 19, 1998 (JP) .......................................... 10-233009

(51) Int. Cl.[7] .............................................. H01L 21/82
(52) U.S. Cl. ...................................................... 438/132
(58) Field of Search ................................ 438/128, 132, 438/601; 257/209, 529, 530

(56) References Cited

U.S. PATENT DOCUMENTS

| | | | |
|---|---|---|---|
| 5,025,300 A | 6/1991 | Billig et al. .................. | 357/51 |
| 5,608,257 A | 3/1997 | Lee et al. .................... | 257/529 |
| 5,760,674 A | 6/1998 | Gilmour et al. ............ | 337/297 |
| 5,773,869 A | 6/1998 | Froehner ..................... | 257/529 |
| 5,851,903 A | 12/1998 | Stamper ..................... | 438/467 |
| 5,872,389 A | 2/1999 | Nishimura et al. ......... | 257/529 |
| 5,949,323 A | 9/1999 | Huggins et al. ............ | 337/401 |
| 5,986,319 A | 11/1999 | Huggins ..................... | 257/529 |
| 6,057,180 A | 5/2000 | Sun et al. ................... | 438/132 |
| 6,168,977 B1 | 1/2001 | Konishi ...................... | 438/132 |
| 6,177,714 B1 | 1/2001 | Nagai ......................... | 257/529 |
| 6,204,548 B1 | 3/2001 | Komai ........................ | 257/529 |

FOREIGN PATENT DOCUMENTS

| | | |
|---|---|---|
| EP | 0860878 A2 | 8/1998 |
| JP | 02-025055 | 1/1990 |

*Primary Examiner*—Evan Pert
(74) *Attorney, Agent, or Firm*—Armstrong, Kratz, Quintos, Hanson & Brooks, LLP

(57) ABSTRACT

The semiconductor device comprises: an insulation film 72 having a contact hole 74 which reaches a substrate 10 formed in; an interconnection layer 78 connected to the substrate 10 through the contact hole 74; a blocking layer 80 formed of the same conducting layer as the interconnection layer 78; an insulation film 82 formed on the insulation film 72; and fuses 88 formed on the insulation film 82 in a region where the blocking layer formed. This structure of the semiconductor device makes it possible that the blocking layer 80 for restraining the laser ablation to be formed without complicating the conventional semiconductor device fabrication steps.

17 Claims, 26 Drawing Sheets

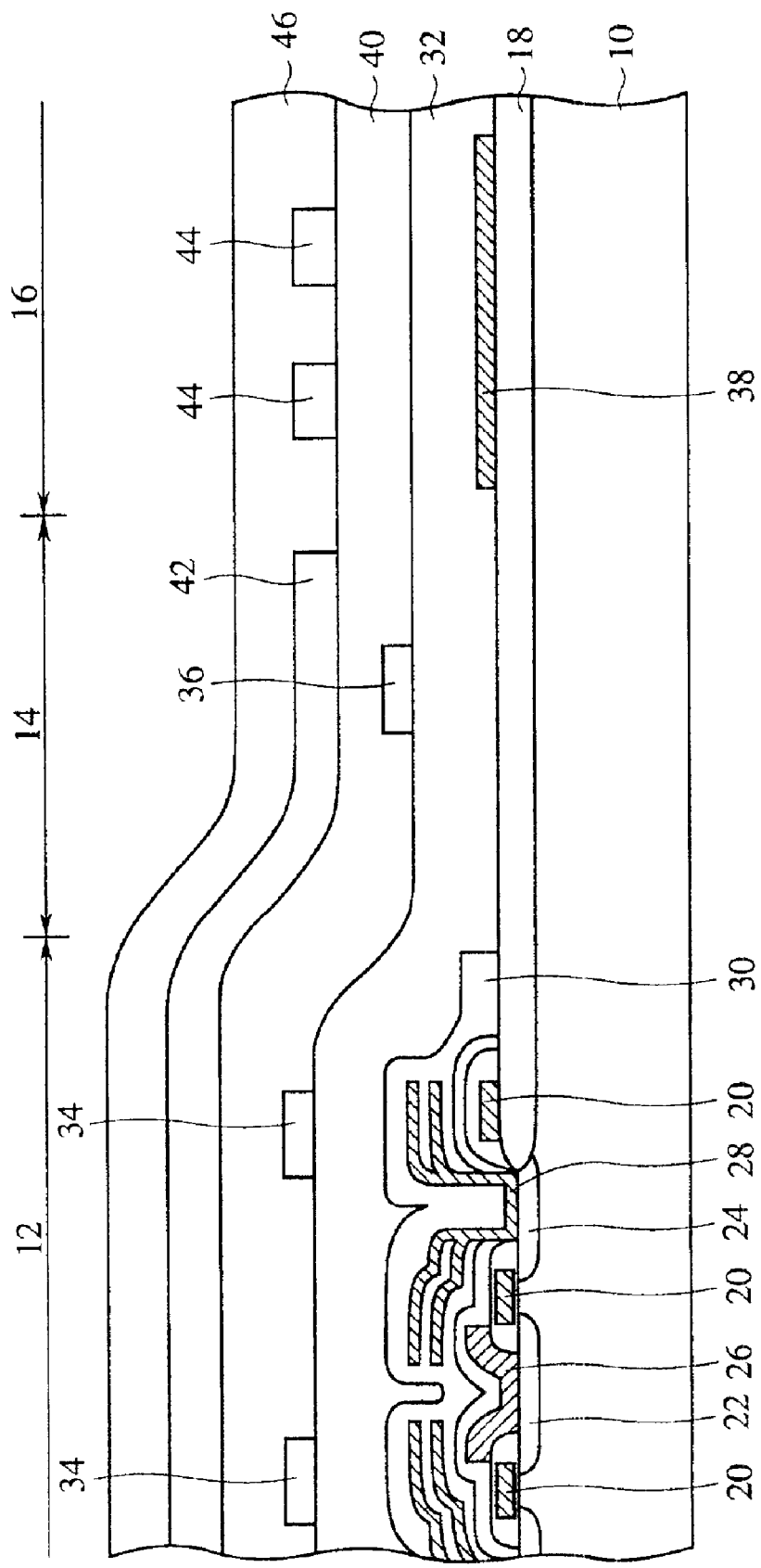

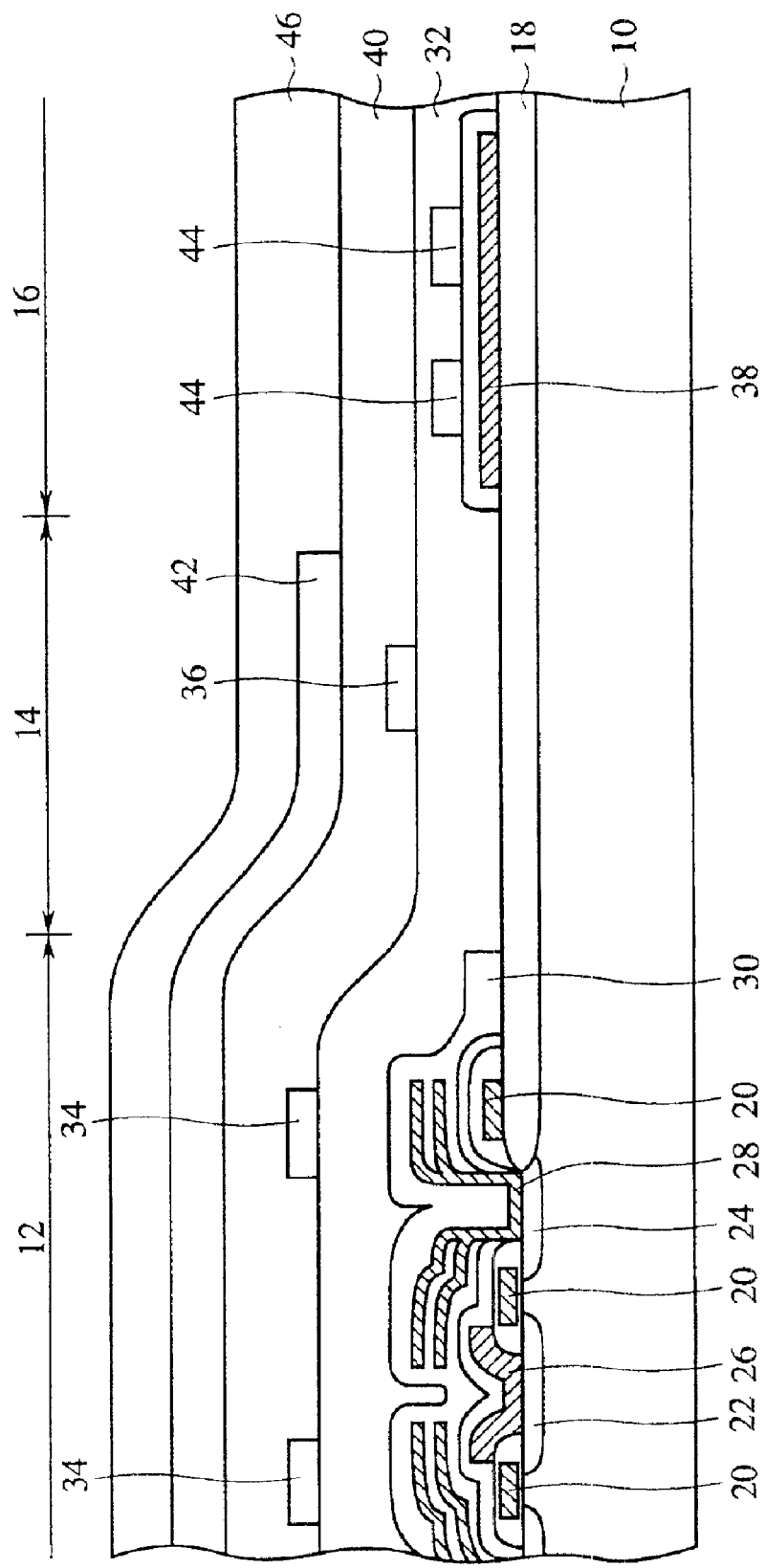

METHOD OF FABRICATING SEMICONDUCTOR DEVICE HAVING BLOCKING LAYER AND FUSE

This is a division of application Ser. No. 09/256,081, filed Feb. 24, 1999, now U.S. Pat. No. 6,333,545.

BACKGROUND OF THE INVENTION

The present invention relates to a semiconductor device including a fuse circuit which can be disconnected by laser ablation and a method for fabricating the semiconductor device.

Semiconductor devices, such as memory devices of DRAMs, SRAMs, etc., logic devices, etc., are constituted by a very large number of elements, and a part of the circuit or of the memory cells are often inoperative due to various cause in their fabrication processes. In this case, when semiconductor devices partially defective circuits or memory cells are generally regarded as defective devices, the semiconductor devices have low fabrication yields, which might lead to fabrication cost increase. In view of this, recently such defective semiconductor devices have defective circuits or defective memory cells replaced by redundant circuits or redundant memory cells which have been prepared in advance, to create properly functioning devices. In some semiconductor devices, a plurality of circuits having functions different from each other are formed integrated and later those of certain functions are replaced, and in other semiconductor devices prescribed circuits are formed, and later characteristics of the semiconductor devices are adjusted. In such reconstruction of semiconductor devices, usually a fuse circuit having a plurality of fuses is formed on the semiconductor devices, and after operation tests, etc., the fuses are disconnected by laser beam irradiation.

A conventional semiconductor device including a fuse circuit and a method for fabricating the same will be explained with reference to FIGS. 25A–25C. FIG. 25A is a diagrammatic sectional view of the conventional semiconductor device, which shows a structure thereof. FIG. 25B is a plan view of the conventional semiconductor device, which shows the structure thereof. FIG. 25C is a diagrammatic sectional view of the conventional semiconductor device with a fuse disconnected, which shows the structure thereof.

A fuse 202 is formed on a substrate 200, connected to a prescribed circuit for replacing the circuit. An inter-layer insulation film 204 for covering the fuse 202 is formed thereon. An interconnection layer 206 is formed on the inter-layer insulation film 204, connected to the fuse 202 therethrough. A plurality of the fuses 202 are formed on the substrate 200 at a prescribed pitch (FIGS. 25A and 25B). Furthermore, there is formed a passivation film 211 which covers the interconnection layer 206 and is thinner partially on the fuses 202.

To disconnect the fuse 202 in such fuse circuit, a laser beam 208 is irradiated to a region where the fuse is formed, whereby the fuse 202 is rapidly heated by its absorbed energy to a high temperature and undergoes laser explosion (FIG. 25C).

Here to further micronize the semiconductor device, it is necessary to further decrease a pitch between the fuses 202, but a pitch P of the fuses 202 is determined by a spot size 210 of the laser beam 208 and alignment accuracy of the laser beam 208.

A spot size of the laser beam 208 has a lower limit which is determined by a wavelength of the laser beam 208, and the spot size 208 can be decreased as the laser beam has a shorter wavelength. However, when a wavelength of the laser beam is too short, there is a risk that the laser beam may pass through a region where the fuse 202 is not formed, arrives at the base semiconductor substrate and is absorbed therein, and cause thermal laser explosion. In a case that the semiconductor substrate is silicon, the laser beam has an about 1 μm wavelength, at which silicon substrates absorb small amounts of laser beams. That is, a lower limit is about 1.5–2.0 μm in spot size.

On the other hand, alignment accuracy is required for the prevention of a disadvantage that the base silicon substrate is damaged if the laser explosion regions overlap each other in blowing both fuses 202 adjacent to each other and also for the prevention of a disadvantage that in disconnecting one of fuses 202 adjacent to each other, the other is damaged or blown. Usually a lower limit of the alignment accuracy is about 0.5 μm.

Thus, a lower limit of the fuse pitch of the above-described conventional fuse disconnecting method is about 2.0–2.5 μm.

As a method for narrowing a pitch P of the fuses, a method using a photoresist is known.

In the method using a photoresist, a photoresist 212 is formed in a step before the step of forming a passivation film 211 of the semiconductor device shown in FIG. 25A (FIG. 26A), a laser beam 208 whose power is low enough not to cause laser explosion is irradiated to expose the photoresist 212 (FIG. 26B), the exposed photoresist 212 is developed to remove the photoresist 212 in the exposed region 214 (FIG. 26C), a fuse 202 is removed by the usual etching process with the photoresist 212 as a mask (FIG. 26D), and the fuse 202 is disconnected with the photoresist 212 as a mask (FIG. 26D).

According to this method, the laser beam 208 may have a power which is sufficient only to expose the photoresist 212, and it is not necessary that the power is high enough to laser explode the fuse 202 or the semiconductor substrate. Accordingly, the laser beam 208 can easily have a shorter wavelength and can have a spot size 210 which is decreased in accordance with a wavelength of the laser beam 208. Accordingly, a fuse pitch P, which is determined by a spot size 210 of the laser beam can be decreased.

However, the method using a photoresist must additionally include a photoresist application step and a photoresist development step, a fuse etching step and a photoresist releasing step. Conventionally, it has caused no trouble that the test process following completion of the wafer process has lower cleanliness in comparison with that in the wafer process clean room, but in a case that a process, such as etching, formation of a passivation film or others, is performed after the test, it is necessary to perform the test process in a clean room of high cleanliness so that dust on wafers does not pollute the etching system, or an etching system which is exclusively used for the fuse disconnection is installed, which leads to higher fabrication costs rather than simple increase of fabrication steps.

As described above, in the conventional fuse disconnecting method, it is difficult to narrow a fuse pitch corresponding to increased integration of a semiconductor device while depressing increase of fabrication steps and fabrication costs.

SUMMARY OF THE INVENTION

An object of the present invention is to provide a structure of a semiconductor device including a fuse circuit which is easily higher integrated and does not add to fabrication cost and a method for fabricating the same.

The present invention provides a semiconductor device and a method for fabricating the same for disconnecting a fuse by laser ablation. Laser ablation is a phenomena that a laser beam of high intensity is irradiated to an object-to-be-irradiated to disconnect bonds of substances by energy of the irradiated laser beam and instantaneously sublimate the object-to-be-irradiated.

The conventional fuse disconnecting method using laser explosion due to absorption of a laser beam converts optical energy to vibrations of stretches, etc. of bonds of substances, i.e., to thermal energy for laser explosion, while laser ablation dissociates bonds of substances directly by optical energy, and is based on the phenomena which is quite different from laser explosion.

Due to such mechanism difference, in the laser ablation, a part a laser beam irradiated to vanishes with a boundary with respect to a part the laser beam has not been irradiated to remain in a beautiful facet. On the other hand, in the conventional laser explosion, the laser explosion takes place up to the vicinity of a part a laser beam is irradiated to, generating a number of particles and blurring the boundary between the laser beam irradiated part and a non-laser beam irradiated part. The cutting edge formed by the laser ablation is different from that formed by the laser explosion, so that the fuse disconnecting method can be distinguished by observing the cutting edge of the fuses.

The laser ablation can thus beautifully remove a laser beam irradiated part but has a disadvantage that substantially all material is instantaneously removed without good controllability, with a result that not only a fuse but also a part of the semiconductor substrate therebelow are removed.

In view of this, the inventors of the present invention made earnest studies and found a material which is difficult to be sublimated by laser ablation. The inventors of the present invention are the first to have made it clear that a blocking layer of the material which is difficult to be sublimated by laser ablation is provided below the fuses to thereby stop the laser ablation on the blocking layer with good controllability. That is, the blocking layer is formed of, e.g., tungsten (W) film, whereby the laser ablation can be stopped with good controllability.

Even in disconnecting fuses by the laser ablation, if the laser ablation can be controlled by the blocking layer, there is no risk that even with laser beams of short wavelengths, semiconductor substrates will not be damaged, as they are damaged by the conventional laser explosion. Accordingly a laser beam can have a small spot size corresponding to a wavelength of the laser beam.

In disconnecting two fuses adjacent to each other, even when both laser spots overlap each other, the blocking layer which is sufficiently thick can keep semiconductor substrates from damage. That is, a fuse pitch can be made smaller in accordance with decrease of a wavelength of the laser beam.

The laser ablation requires only a laser system to disconnect fuses and requires no additional etching system, etc., and increases neither fabrication steps and fabrication costs.

A method for disconnecting the fuses by the laser ablation is detailed in Japanese Patent Application No. 10-151309/1998 which an inventor of the present application is joined as a co-inventor.

That is, the above-described object is achieved by a semiconductor device comprising: a blocking layer formed on a substrate; and a plurality of fuses formed above the blocking layer through an insulation film, wherein irradiation regions of laser beams for disconnecting the fuses provided for the respective plural fuses are arranged with staggered arrangement. This structure of the semiconductor device can prohibit irradiation regions of laser beams from overlapping each other, whereby the fuses can be arranged without making a fuse pitch larger. Accordingly, the fuse region can be smaller.

The above-described object is also achieved by a semiconductor device comprising: a blocking layer formed on a substrate; and a plurality of fuses formed above the blocking layer through an insulation film, wherein the blocking layer is divided in portions corresponding to respective regions respectively containing at least one irradiation region of a laser beam for disconnecting the fuse. This structure of the semiconductor device can prevent leak current from flowing to the fuses through the blocking layer, whereby disadvantages that leak current flows into one fuses from a plurality of fuses, and a disadvantage of increased power consumption.

The above-described object is also achieved by a semiconductor device comprising: a blocking layer formed on a substrate; and a plurality of fuses formed above the blocking layer through an insulation film, wherein the blocking layer in a region where irradiation regions of laser beams for disconnecting the fuses overlap each other has a larger thickness than that of the blocking layer in the rest region. This structure of the semiconductor device prohibits twice or more laser ablation to a fuse from arriving at the substrate, whereby a small fuse pitch can be used without considering overlap of laser spots. A dimension in a direction of extension of the fuses can be also small, which permits the semiconductor device to be further micronized.

The above-described object is achieved by a semiconductor device comprising: a first insulation film formed on a substrate and having a contact hole which reaches the substrate formed in; an interconnection layer formed on the first insulation film and connected to the substrate through the contact hole; a blocking layer formed on the first insulation film and formed of the same conducting layer as the interconnection layer; a second insulation film formed on the first insulation film with the blocking layer and the interconnection layer formed on; and fuses formed on the second insulation film in a region where the blocking layer is formed. This structure of the semiconductor device makes it possible that the blocking layer for restraining the laser ablation to be formed without complicating the conventional semiconductor device fabrication steps.

The above-described object is also achieved by a semiconductor device comprising: a first insulation film formed on a substrate and having a contact hole which reaches the substrate formed in; a plug buried in the contact hole and connected to the substrate; a blocking layer formed on the first insulation film and formed of the same conducting layer as the plug; a second insulation film formed on the first insulation film with the plug and the blocking layer formed on; and fuses formed on the second insulation film in a region where the blocking layer formed. This structure of the semiconductor device makes it possible that the blocking layer for restraining the laser ablation to be formed without complicating the conventional semiconductor device fabrication steps.

In the above-described semiconductor device, it is preferable that the first insulation film further has an opening formed in at least a region where irradiation regions of laser beams for disconnecting the fuses overlap each other, and the blocking layer is buried in the opening. This structure of the semiconductor device makes it possible to make a fuse pitch smaller without complicating the semiconductor device fabrication steps and without considering overlap of laser spots.

In the above-described semiconductor device, it is preferable that the blocking layer includes a tungsten layer. The tungsten layer is suitable for restraining the laser ablation.

The above-described object is also achieved by a semiconductor device comprising: a first insulation film formed on a substrate and having a first contact hole formed in a first region and a first opening formed in a second region; a first plug buried in the first contact hole; a first blocking layer buried in the first opening and formed of the same conducting layer as the first plug; a second insulation film formed on the first insulation film and having a second contact hole formed in a third region and a second opening formed in the second region; a second plug buried in the second contact hole; a second blocking layer buried in the second opening and formed of the same conducting layer as the second plug; a third insulation film formed on the second insulation film with the second plug and the second blocking layer; and a fuse formed on the second region on the third insulation film. This structure of the semiconductor device makes it possible that the blocking layer for restraining the laser ablation to be formed without complicating the conventional semiconductor device fabrication steps.

In the above-described semiconductor device, it is preferable that the second blocking layer is formed in a region where at least the first blocking layer is not formed, and the first blocking layer and the second blocking layer form an uninterrupted blocking region as viewed in a plan layout. This structure of the semiconductor device makes it possible that the blocking layer having a thickness corresponding to a thickness of the insulation film can be formed without complicating the semiconductor device fabrication steps.

The above-described object is also achieved by a semiconductor device comprising a memory cell region with a plurality of memory cells formed in, and a fuse circuit region with a fuse circuit for switching a defective memory cell to a redundant memory cell formed in, the semiconductor device comprising: a blocking layer formed in the fuse circuit region and formed of the same conducting layer as a first interconnection layer formed in the memory cell region; an insulation film formed on the blocking layer; a fuse formed on the insulation film in the fuse circuit region and formed of the same conducting layer as a conducting layer forming the memory cells or a second interconnection layer formed in the memory cell region. Thus the blocking layer is formed of the same conducting layer as the interconnection layer used in the memory cell region, and the fuses are formed of the same conducting layer as the conducting layer forming the memory cells or the interconnection layer formed in the memory cell region, whereby the DRAM including the fuses which can be disconnected by laser ablation can be fabricated without complicating the conventional semiconductor device fabrication steps.

The above-described object is also achieved by a semiconductor device comprising a memory cell region with a plurality of memory cells formed in, and a fuse circuit region with a fuse circuit for switching a defective memory cell to a redundant memory cell formed in, the semiconductor device comprising: a blocking layer formed in the fuse circuit region and formed of a first conducting layer formed in the memory cell region; an insulation film formed on the blocking layer; and a fuse formed on the insulation film in the fuse circuit region and formed of a same conducting layer as a second conducting layer forming the memory cells or a third conducting layer forming an interconnection layer formed in the memory cell region. Thus, the blocking layer is formed of the same conducting layer as the conducting layer used in the memory cell region, and the fuses are formed of the same conducting layer as the conducting layer forming the memory cells or the interconnection layer formed in the memory cell region, whereby the DRAM including the fuses which can be disconnected by laser ablation can be fabricated without complicating the conventional semiconductor device fabrication steps.

The above-described object is also achieved by a method for fabricating the semiconductor device comprising the steps of: forming on a substrate a first insulation film having a contact hole which reaches the substrate formed in; depositing a first conducting film on the first insulation film and patterning the same to form a first interconnection layer connected to the substrate through the contact hole and formed of the first conducting film, and a blocking layer formed of the first conducting film; forming a second insulation film on the first insulation film with the first interconnection layer and the blocking layer formed on; and depositing a second conducting film on the second insulation film and patterning the same to form a second interconnection layer formed of the second conducting film, and fuses formed above the blocking layer and formed of the second conducting film. This fabrication steps of the semiconductor device permits the first interconnection layer and the blocking layer to be formed of the same conducting layer, whereby the fuse circuit which can be disconnected by laser ablation without complicating the conventional semiconductor device fabrication steps.

In the above-described method for fabricating the semiconductor device, it is preferable that in the step of forming the first insulation film, an opening which reaches the substrate is further formed in the first insulation film in a region where irradiation regions of laser beams for disconnecting the fuses overlap each other, and in the step of forming the first interconnection layer and the blocking layer, the blocking layer is formed, buried in the opening and extended over the first insulation film. In forming the contact hole, an opening is in advance formed in a region where irradiation regions of laser beams for disconnecting fuses overlap each other, whereby the blocking layer in the region where irradiation regions of laser beams overlap each other can be thick. The fuses can be arranged without considering overlap of laser spots.

The above-described object is also achieved by a method for fabricating the semiconductor device comprising the steps of: forming on a substrate a first insulation film having a contact hole which reaches the substrate formed in; forming a plug buried in the contact hole and formed of a first conducting film, and a blocking layer on the first insulation film and formed of the first conducting film; forming a second insulation film on the first insulation film with the plug and the blocking layer formed on; and depositing a second conducting film on the second insulation film and patterning the same to form an interconnection layer formed of the second conducting film, and a fuse formed above the blocking layer and formed of the second conducting film. This fabrication steps of the semiconductor device permits the plug and the blocking layer to be formed of the same conducting layer, whereby the fuse circuit which can be disconnected by laser ablation can be fabricated without complicating the conventional semiconductor device fabrication steps.

In the above-described method for fabricating the semiconductor device, it is preferable that in the step of forming the plug and the blocking layer, the first conducting film is formed on the first insulation film, a photoresist is formed on the first conducting film in a region where the blocking layer is to be formed, and the first conducting film is etched back with the photoresist as a mask, whereby the plug buried in the contact hole, and the blocking layer formed on the first insulation film are formed. This fabrication steps of the semiconductor device makes it possible that the blocking layer is formed by adding the step of once lithography to the conventional semiconductor device fabrication steps.

In the above-described method for fabricating the semiconductor device, it is preferable that in the step of forming the first insulation film, an opening which reaches the substrate is further formed in the first insulation film in a region where the blocking layer is to be formed, and in the step of forming the plug and the blocking layer, the first conducting film is formed on the fist insulation film, and the first conducting film is etched back, whereby the plug buried in the contact hole, and the blocking layer buried in the opening are formed. This fabrication steps of the semiconductor device makes it possible that the blocking layer having a thickness corresponding to a thickness of the first insulation film can be formed without complicating the conventional semiconductor device fabrication steps.

In the above-described method for fabricating the semiconductor device, it is preferable that the method further comprises the step of: disconnecting the fuse by a laser ablation.

In the above-described method for fabricating the semiconductor device, it is preferable that in the step of forming the blocking layer, the blocking layer including a tungsten layer is formed.

The above-described object is also achieved by a method for fabricating the semiconductor device comprising the steps of: forming on a substrate a first insulation film having a first contact hole formed in a first region, and a first opening formed in a second region formed in; depositing a first conducting film on the first insulation film and etching back the same to form a first plug buried in the first contact hole and formed of the first conducting film, and a first blocking layer buried in the first opening and formed of the first conducting film; forming on the first insulation film with the first plug and the first blocking layer formed on a second insulation film having a second contact hole formed in a third region and a second opening formed in the second region; depositing a second conducting film on the second insulation film and etching back the same to form a second plug buried in the second contact hole and formed of the second conducting film, and a second blocking layer buried in the second opening and formed of the second conducting film; forming a third insulation film on the second insulation film having the second plug and the second blocking layer formed on; and forming a fuse on the third insulation film in the second region. This fabrication steps of the semiconductor device makes it possible that the first blocking layer and the second blocking layer form a thick blocking layer can be formed without complicating the conventional semiconductor device fabrication steps.

In the above-described method for fabricating the semiconductor device, it is preferable that the second blocking layer is formed in a region where at least the first blocking layer is not formed to constitute by the first blocking layer and the second blocking layer an uninterrupted blocking region as viewed in a plan layout.

In the above-described method for fabricating the semiconductor device, it is preferable that the method further comprises the step of: disconnecting the fuse by a laser ablation.

In the above-described method for fabricating the semiconductor device, it is preferable that in the step of forming the first conducting film, the first conducting film including a tungsten layer is formed, and in the step of forming the second conducting film, the second conducting film including a tungsten layer is formed.

BRIEF DESCRIPTION OF THE DRAWINGS

FIG. 2 is a diagrammatic sectional view of the semiconductor device according a first modification of the first embodiment, which shows a structure thereof.

FIG. 3 is a diagrammatic sectional view of the semiconductor device according to a second modification of the first embodiment, which shows a structure thereof.

DETAILED DESCRIPTION OF THE INVENTION

[A First Embodiment]

The semiconductor device according to a first embodiment of the present invention will be explained with reference to FIG. 1.

Figure 1:
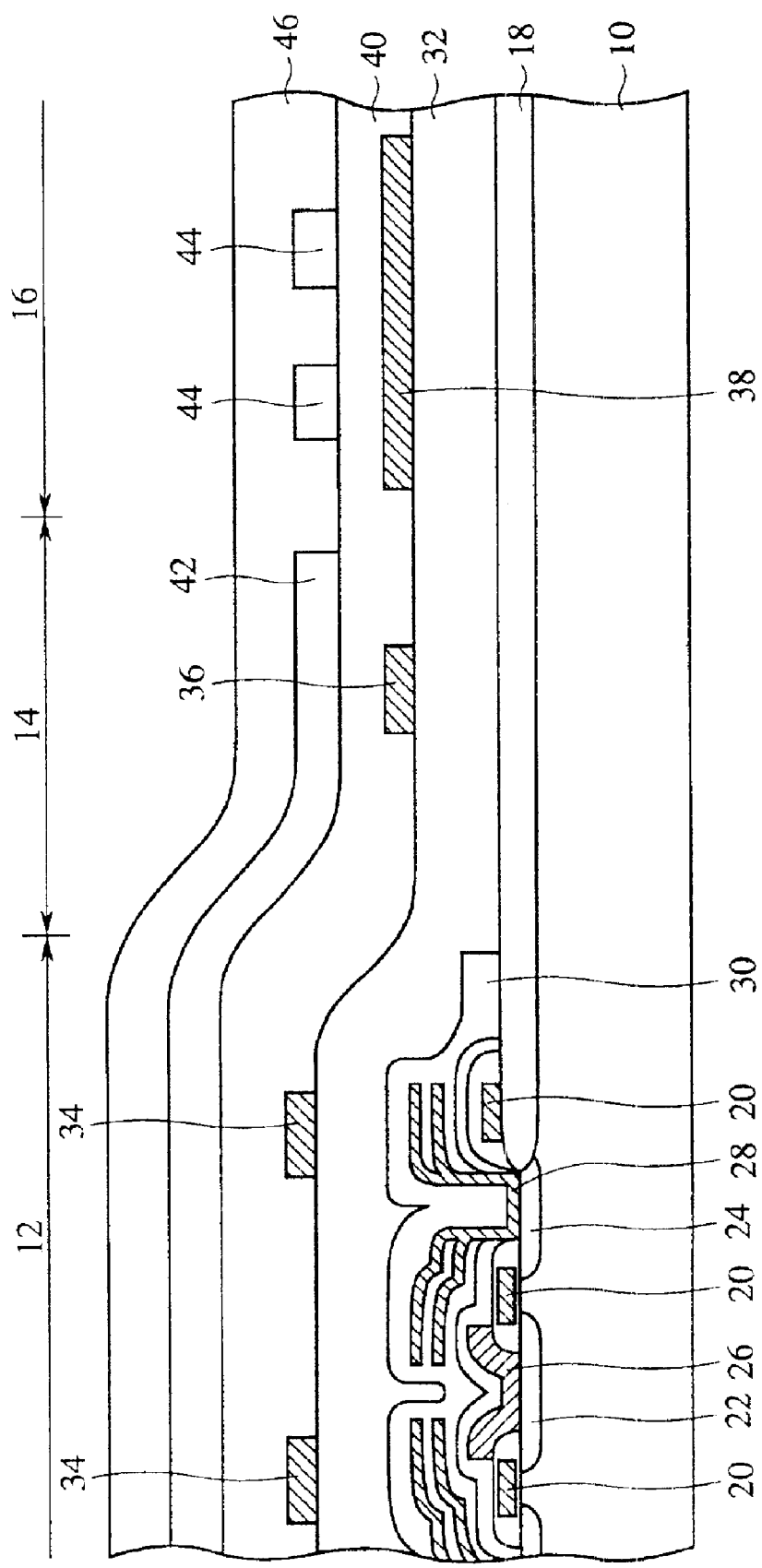
FIG. 1 is a diagrammatic sectional view of the semiconductor device according to a first embodiment of the present invention, which shows a structure thereof.

FIG. 1 is a diagrammatic sectional view of the semiconductor device according to the present embodiment, which shows a structure thereof.

In the present embodiment, one example of realizing a DRAM including a fuse circuit which can be disconnected by laser ablation, without complicating the conventional DRAM fabrication steps will be explained. The DRAM uses the fuse circuit for switching an address circuit for designating a memory cell, so that a required fuse of the fuse circuit is disconnected to switch an address of a defective memory cell to a redundant memory cell. The DRAM is so arranged that even when a part of the memory cells is defective, the memory cell is switched to a redundant memory cell to thereby prevent the device as a whole from becoming defective.

On a silicon substrate 10, there are defined a memory cell region 12 in which a plurality of memory cells are formed, a peripheral circuit region 14 in which a peripheral circuits for driving the memory cells are formed, and a fuse circuit region 16 for switching a defective memory cell to a redundant memory cell.

On the silicon substrate 10, a device isolation film 18 is formed for defining a device region. On the silicon substrate 10 in the memory cell region 12, a transfer transistor including a gate electrode 20, and source/drain diffused layers 22, 24 are formed. A bit line 26 is connected to the source/drain diffused layer 22. A fin-shaped storage electrode 28 is connected to the source/drain diffused layer 24. The storage electrode 28 is covered with an opposed electrode 30 through a dielectric film (not shown). The storage electrode 28, the dielectric film and the opposed electrode 30 constitute a capacitor. Thus, in the memory cell region 12, a plurality of the memory cells constituted by the transfer transistors and the capacitors are formed. A structure of the memory cell shown in FIG. 1 is detailed in, e.g., Japanese Patent Publication No. 28476/1996 filed by the applicant of the present application.

In the peripheral circuit region 14, there are formed a plurality of peripheral transistors (not shown) constituting peripheral circuits. An inter-layer insulation film 32 is formed on the silicon substrate 10 with the memory cells and the peripheral transistors formed on. On the inter-layer insulation film 32 there are formed a strapping word line 34, an interconnection layer 36 interconnecting the peripheral transistors to constitute peripheral circuits, and a blocking layer 38 for restraining laser ablation, which are formed of the same conducting layer including tungsten (W) film. An inter-layer insulation film 40 is formed on the inter-layer insulation film 32 with the strapping word line 34, the interconnection layer 36 and the blocking layer 38 formed on. On the inter-layer insulation film 40, there are formed an interconnection layer 42 and a fuse 44 formed of the same Al alloy layer. A cover film 46 is formed on the inter-layer insulation film 40 with the interconnection layer 42 and the fuse 44 formed on.

As described above, the semiconductor device according to the present embodiment is characterized in that the blocking layer 38 and the fuse 44 are formed of the same conducting layer forming the other interconnection layers. That is, the fuse 44 of the fuse circuit is formed of the same conducting layer forming the second metal interconnection layer (the interconnection layer 42) included in the DRAM, and the blocking layer 38 is formed of the same conducting layer forming the first metal interconnection layer (the strapping word line 34 and the interconnection layer 36) including tungsten film. This constitution of the semiconductor device allows the blocking layer 38 and the fuse 44 to be formed simultaneously with the other interconnection layers, whereby the fuse circuit, which can be disconnected by laser ablation with good controllability can be fabricated without complicating the conventional fabrication steps.

In the present embodiment, the interconnection layer forming the fuses 44 is the second metal interconnection layer but is not essentially the second metal interconnection layer. That is, in the laser ablation, the target is sublimated sequentially from the top layer, so that the fuses can be formed of any of the interconnection layers. It is not essential that the interconnection layer forming the fuses 44 is the uppermost interconnection layer. Even in a case that three or more metal interconnection layers are included, the fuses 44 may be formed of any of the metal interconnection layers. However, decreasing the films on the fuses allows a total power of the laser ablation to be decreased, and furthermore, merits of increased throughputs and laser ablation control with higher accuracy. Thus, it is preferable that the fuses is formed of an uppermost conducting layer.

The blocking layer 38 of a material which is not easily sublimated by laser ablation is positioned below the fuse 44, whereby the fuse 44 may be formed of a metal interconnection layer or another conducting layer.

Recently, in consideration of a requirement of lower resistance of gate electrodes, metal gate structures, poly/metal gate structures of a stacked film of polycrystalline silicon film and refractory metal film, etc. are studied. In some cases that such gate structures are used, the gate electrode 20 includes tungsten film. Thus, as exemplified in FIG. 2, the blocking layer 38 can be formed of the same conducting layer as the gate electrode 20.

As exemplified in FIG. 3, it is possible that the fuse 44 is formed of the same conducting layer as the opposed electrode 30, and the blocking layer 38 is formed below the fuse 44. The blocking layer 38 may be formed of a film additionally inserted. The blocking layer 38 may be also formed of a conducting layer positioned below the fuse 44, e.g., the same conducting layer as the storage electrode 28, the bit line 26, or the word line 20.

Similarly, the fuse 44 may be formed of the same conducting layer as the storage electrode 28 or the bit line 26.

In the present embodiment, the fuse circuit of the DRAM having the fin-shaped capacitor is used. However, the DRAM having the fin-shaped capacitor is not essential, and DRAMs of various structures may be used. In addition to the DRAMs, SRAMs, other memory devices, and logic devices may be used.

[A Second Embodiment]

The semiconductor device according to a second embodiment of the present invention will be explained with reference to FIGS. 4A and 4B.

Figure 4A:
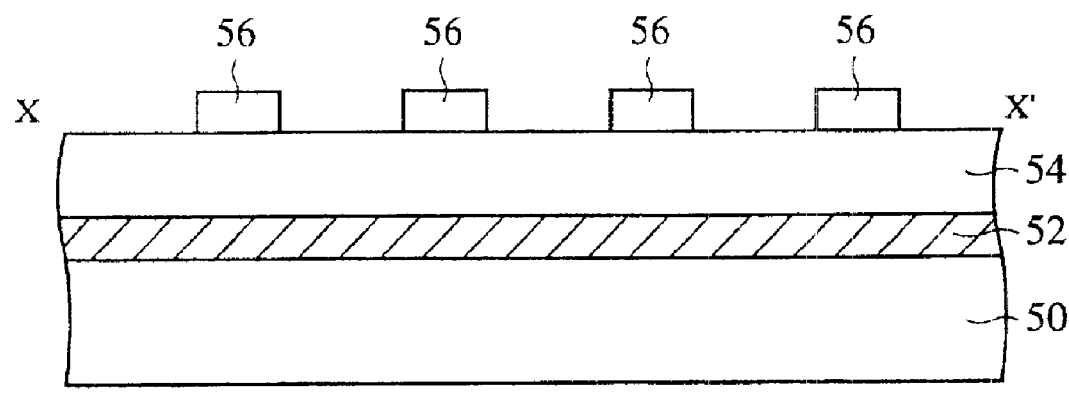
FIG. 4A is a plan view of the semiconductor device according to a second embodiment of the present invention, which show a structure thereof.

FIG. 4A is a plan view of the semiconductor device according to the present embodiment, which show a structure thereof. FIG. 4B is a sectional view of the semiconductor device according to the present embodiment, which show a structure thereof.

As described above, in the fuse disconnecting method using laser ablation, even when both two fuses adjacent to each other are disconnected, there is no risk that even overlapped laser beam spots may damage the semiconductor substrate when the blocking layer has a sufficient thickness. However, when alignment with a device structure is considered as in the semiconductor device according to, e.g., the first embodiment, it will be often difficult that the blocking layer has a large film thickness. In such case, when adjacent fuses are disconnected by overlapped laser beam spots, there is a risk that the laser ablation may pass through the blocking layer down to the lower insulation film and, in a worst case, may reach and damage the semiconductor substrate.

The semiconductor device according to the present embodiment has a structure which can stop laser ablation without making the blocking layer thicker.

The structure of the semiconductor device according to the present embodiment will be explained with reference to FIGS. 4A and 4B. FIG. 4A is a diagrammatic sectional view of the semiconductor device according to the present embodiment, which shows the structure, and FIG. 4B is a plan view of the semiconductor device, which shows the structure.

A blocking layer 52 for restraining laser ablation is formed on a substrate 50. The blocking layer 52 has a film thickness sufficient to bear at least once laser ablation. A plurality of fuses 56 are formed through an inter-layer insulation film 54 on the substrate with the blocking layer 52 formed on. The fuses 56 have a pitch which, when one of the fuses 56 is disconnected, prevents a spot region of a laser beam from overlapping the other fuses 56.

The semiconductor device according to the present embodiment is characterized in that a spot region 58 of each fuse 56 for a laser beam to be irradiated to is staggered with respect to a spot region 58 of its adjacent fuse 56. The so-called staggered arrangement of the spot regions 58 prevents the spot regions 58 of adjacent ones of the fuses 56, where the fuses 56 are to be disconnected, from overlapping each other. Resultantly the blocking layer 52 is not exposed to twice laser ablation.

Accordingly, the blocking layer 52 may have a film thickness sufficient to bear once laser ablation and the blocking layer 52 may not be unnecessarily thick. A fuse pitch may be determined only in consideration of a laser spot for disconnecting one fuse 56, and even in a case that the blocking layer 52 is thin, a larger pitch is not necessary.

As described above, according to the present embodiment, a laser beam spot region 58 where each fuse 56 is disconnected is staggered with respect to that of its adjacent one, whereby even in case that the blocking layer 52 is thin, the fuses 56 can be laid out without making a fuse pitch larger.

Figure 4B:
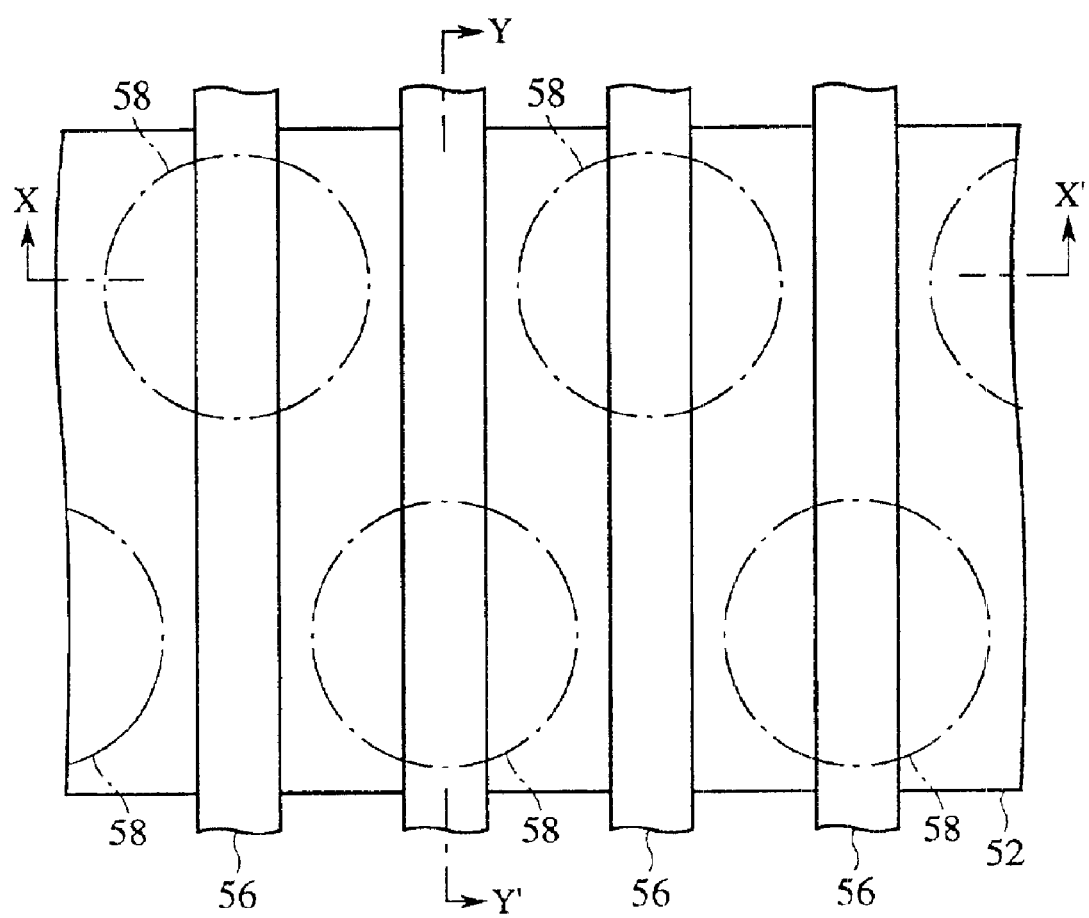
FIG. 4B is a diagrammatic sectional view of the semiconductor device according to the second embodiment of the present invention, which show a structure thereof.

In the semiconductor device shown in FIGS. 4A and 4B, the fuse disconnecting regions are staggered with respect to each other in two rows in the longitudinal direction of the fuses 56 but may be staggered with each other in three or more rows.

[A Third Embodiment]

The semiconductor device according to a third embodiment of the present invention will be explained with reference to FIGS. 5 and 6A–6B. The same members of the present embodiment as those of the semiconductor device according to the second embodiment are represented by the same reference numbers not to repeat or to simplify their explanation.

Figure 5:
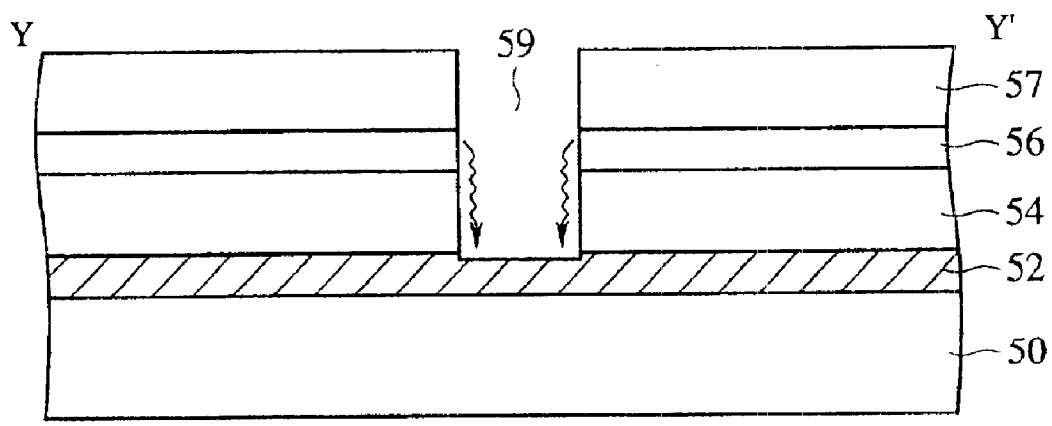
FIG. 5 is a view explaining a problem occurring in disconnecting a fuse after a cover film has been formed.
Figure 6A:
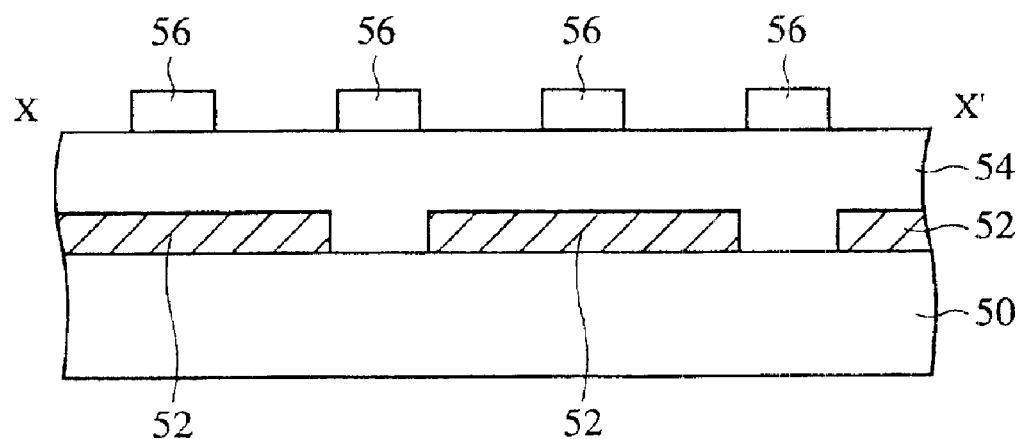
FIG. 6A is a plan view of the semiconductor device according to a third embodiment of the present invention, which show a structure thereof.
Figure 6B:
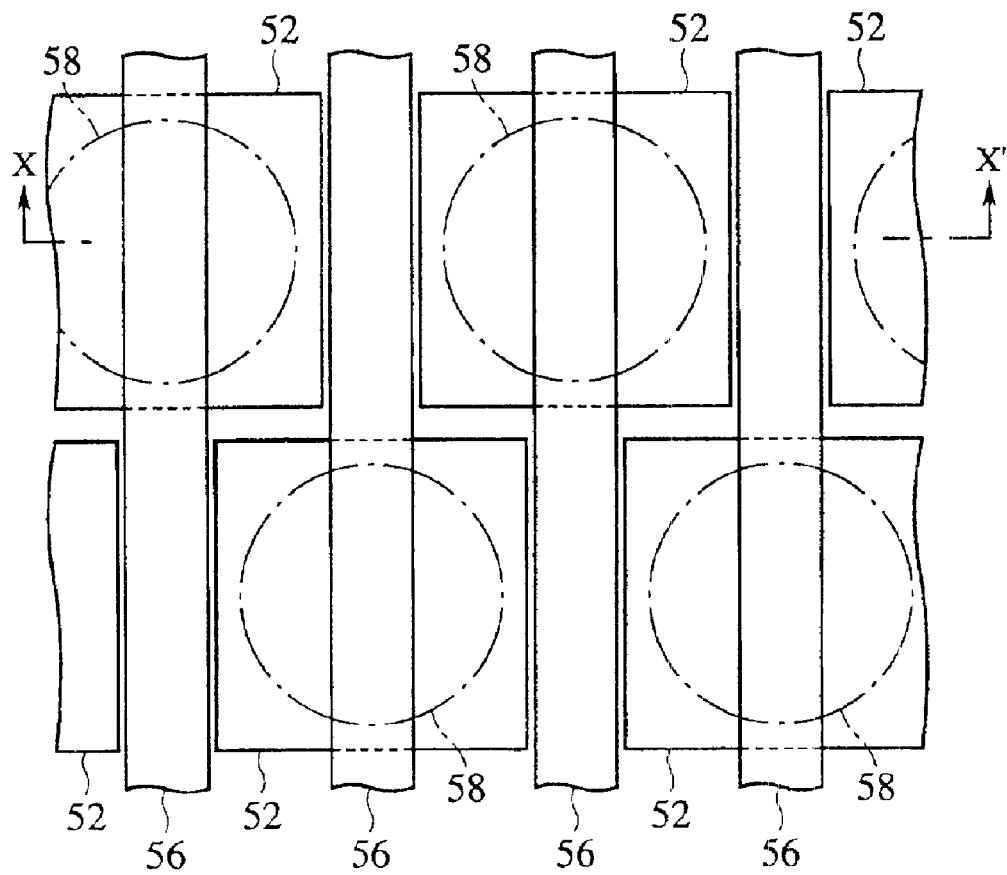
FIG. 6B is a diagrammatic sectional view of the semiconductor device according to the third embodiment of the present invention, which show a structure thereof.

FIG. 5 is a view explaining a problem of disconnecting a fuse after a cover film has been formed. FIG. 6A is a plan view of the semiconductor device according to the present embodiment, which show a structure thereof. FIG. 6B is a sectional view of the semiconductor device according to the present embodiment, which show a structure thereof.

The fuse disconnecting method using laser ablation can disconnect a fuse without influence of a film, such as thick cover film or polyimide film, formed on the fuses, which allows a semiconductor device fabrication method to be much simplified.

However, in the semiconductor device exemplified in FIG. 5, which includes a blocking layer 52, an inter-layer insulation film 54, a fuse 56 and a cover film 57 formed on a substrate 50, when the fuse 56 is disconnected on the cover film 57, the fuse 56 and the blocking layer 52 are exposed in a disconnecting hole 59 formed to disconnect the fuse 56. Unless a passivation film (not shown) covering the sectional surface of the fuse 56 is formed, water attaches to the inside wall of the disconnecting hole 59, and there is a risk that leak current may flow between the fuse 56 and the blocking layer 52 through the inside wall surface (see FIG. 5). In a worst case, leak current flows between all disconnected fuses 56 and the blocking layer 52, and a risk that currents may flow from a number of fuses to a specific one is considered. The respective leak currents are very low, but when leak currents flow from a number of fuses, these leak currents much affect a standby current and lead to increased electric power consumption of the device.

The semiconductor device according to the present embodiment has a structure which can prevent current leak from the fuses through the blocking layer.

The semiconductor device according to the present embodiment is characterized in that the blocking layer 52 is arranged interrupted in respective fuse disconnecting regions. That is, as shown in FIG. 6A, the blocking layer 52 is disposed insulated from each other below respective staggered spot regions 58. The blocking layer 52 is thus divided, whereby a current which flows between each fuse 56 and its associated blocking layer 52 does not flow to the other fuse 56. The leak current can be much decreased.

As described above, according to the present embodiment, the blocking layer 52 is disposed for the respective fuse disconnecting regions, whereby flow of leak currents among the fuses 56 through the blocking layer 52 can be prevented. Accordingly electric power consumption can be decreased.

In the present embodiment, the blocking layer 52 is disposed interrupted optimumly for the respective spot regions 58, but the blocking layer 52 is not essentially interrupted for the respective spot regions. That is, in the sense that leak currents are prohibited from flowing collectively to a specific fuse in a large amount, the blocking layer 52 is disposed interrupted for respective 2 or 3 spot regions 58 in a small number which can prohibit collection of leak currents into a large amount, whereby the effect can be expected. A number of spot regions 58 for one part of the blocking layer 52 can be selected suitably for an expected leak current, etc.

The present embodiment is applied to the semiconductor device according to the second embodiment, in which the spot regions 58 are staggered arrangement but is applicable to semiconductor devices having the spot regions 58 laid in any arrangement.

The leak current between the fuses and the blocking layer can be prevented also by, as described in the specification of Japanese Patent Application No. 151309/1998, disconnecting fuses before forming the cover film.

[A Fourth Embodiment]

The semiconductor device and the method for fabricating the same according to a fourth embodiment of the present invention will be explained with reference to FIGS. 7, 8, 9A–9C and 10A–10B.

Figure 7:
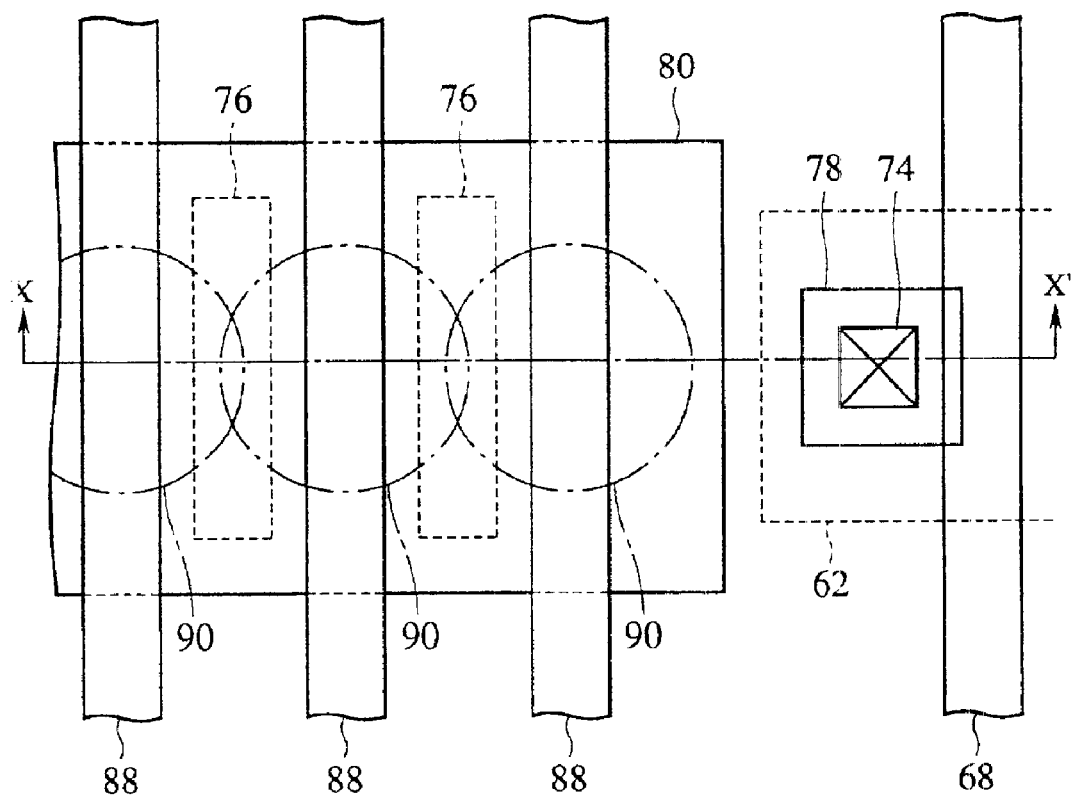
FIG. 7 is a plan view of the semiconductor device according to a fourth embodiment of the present invention, which shows a structure thereof.
Figure 8:
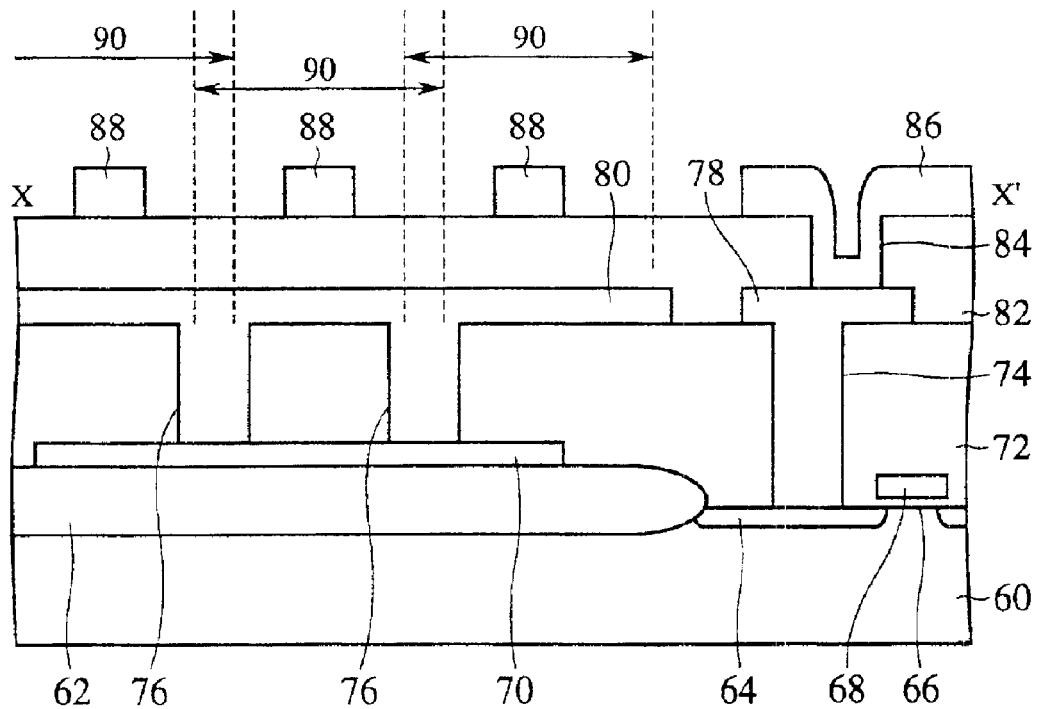
FIG. 8 is a diagrammatic sectional view of the semiconductor device according to the fourth embodiment of the present invention, which shows the structure thereof.

FIG. 7 is a plan view of the semiconductor device according to the present embodiment, which shows a structure thereof. FIG. 8 is a diagrammatic sectional view of the semiconductor device according to the present embodiment, which shows the structure thereof. FIGS. 9A–9C and 10A–10B are sectional views of the semiconductor device according to the present embodiment in the steps of the method for fabricating the same, which shows the method.

First, the structure of the semiconductor device according to the present embodiment will be explained with reference to FIGS. 7 and 8. FIG. 8 is the sectional view along the line X–X' in FIG. 7.

A device isolation film 62 for defining a device region is formed on a silicon substrate 60. In the device region defined by the device isolation film 62, a MOS transistor constituted by a gate electrode 68 formed on the silicon substrate 60 through a gate insulation film 66, and a source/drain diffused layers 64 formed on both sides of the gate electrode 68. On the device isolation film in a fuse forming region, a conducting layer 70 which functions as an etching stopper film is formed. An inter-layer insulation film 72 is formed on the silicon substrate 60 with the MOS transistor, etc. thus formed on, and through the inter-layer insulation film 72, there are formed a contact hole 74 which reaches the source/drain diffused layer 64, and grooves 76 which reach the conducting layer 70 in the fuse forming region. On the inter-layer insulation film 72, there are formed an interconnection layer 78 connected to the source/drain diffused layer 64 through the contact hole 74, and a blocking layer 80 formed of the same conducting layer as the interconnection layer 78 and extended over the inter-layer insulation film 72 buried in the grooves 76. An inter-layer insulation film 82 with a contact hole 84 arriving at the interconnection layer 78 formed in is formed on the inter-layer insulation film 72 with the interconnection layer 78 and the blocking layer 80 formed on. On the inter-layer insulation film 82, there are formed an interconnection layer 86 connected to the interconnection layer 78 through the contact hole 84, and fuses 88 formed of the same conducting layer as the interconnection layer 86 and formed above the blocking layer 80.

The semiconductor device according to the present embodiment is characterized in that the grooves 76 are formed in the inter-layer insulation film 72 in regions where spot regions 90 of laser beams for disconnecting the fuses 88 overlap each other, and the blocking layer 80 in the regions are made thicker. This structure of the semiconductor device can prevents laser ablation from advancing through the blocking layer 80 even when adjacent fuses 88 are disconnected, whereby the fuse pitch can be smaller without arranging the fuse disconnecting regions with staggered arrangement as in the second embodiment.

Next, the characteristic of the semiconductor device according to the present embodiment and the method for fabricating the same will be detailed in accordance with the steps of the method for fabricating the semiconductor device.

First, the device isolation film 62 is formed on a silicon substrate 60 by, e.g., the usual LOCOS method.

Figure 9A:
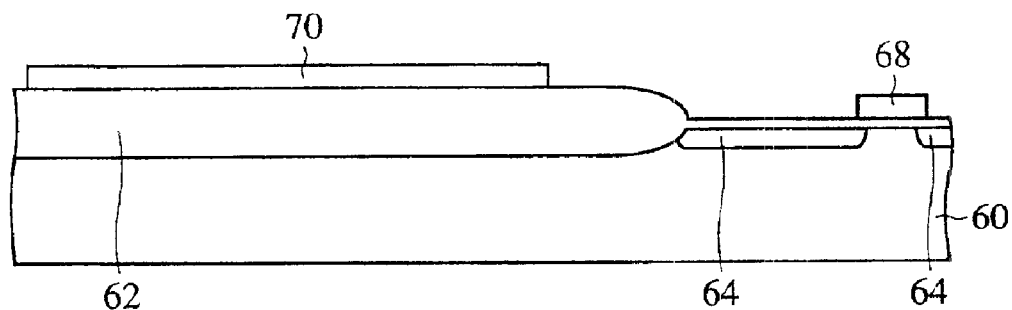
FIGS. 9A–9C and 10A–10B are sectional views of the semiconductor device according to the fourth embodiment of the present invention in the steps of the method for fabricating the same, which show the method.

Then, a MOS transistor constituted by the source/drain diffused layers 64 and the gate electrode 68 is formed in the same way as a usual MOS transistor fabrication method (FIG. 9A). At this time, the conducting layer 70 of the same layer as the gate electrode 68 is left in the fuse forming region.

The conducting layer 70 is to be used as an etching stopper film in forming the grooves 76 in the inter-layer insulation film 72. The conducting layer 70 is not essential, and is not necessary in a case that the grooves 76 can be etched with good controllability without affecting the ground. The conducting layer 70 is not essentially formed of the same conducting layer as the gate electrode 68, and, in, e.g., a DRAM, can be formed of the same conducting layer of a capacitor opposed electrode, such as polycrystalline silicon film or others. The conducting layer 70 may be another film as long as the film can be the etching stopper for the inter-layer insulation film 72.

Subsequently, the inter-layer insulation film 72 of silicon oxide film is formed on the entire surface by, e.g., CVD method.

Figure 9B:
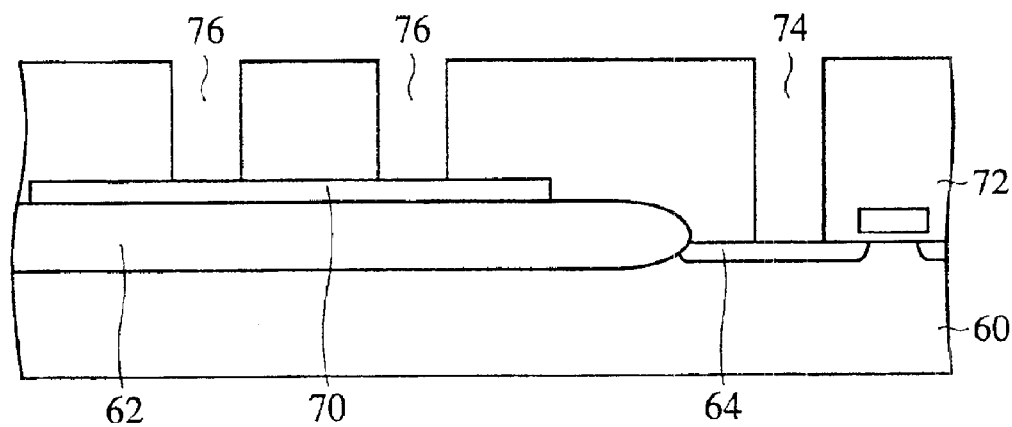

Then, the contact hole 74 which reaches the source/drain diffused layer 64, and the grooves 76 which reach the conducting layer 70 are formed in the inter-layer insulation film 72 by the usual lithography and etching. (FIG. 9B).

Then, a tungsten film is deposited on the entire surface by, e.g., CVD method. At this time, it is preferable that the tungsten film has a thickness which can bear at least once laser ablation and which is sufficient to fill the grooves 76 and the contact hole 74.

For better adhesion and lower contact resistance of the tungsten film with respect to the silicon substrate 10, it is usual to provide an adhesion layer/contact layer of, e.g., TiN film/Ti film below the tungsten film. This structure is applicable to the method for fabricating the semiconductor device according to the present embodiment. Other films, such as an anti-reflection film, etc. may be formed on the tungsten film.

Figure 9C:
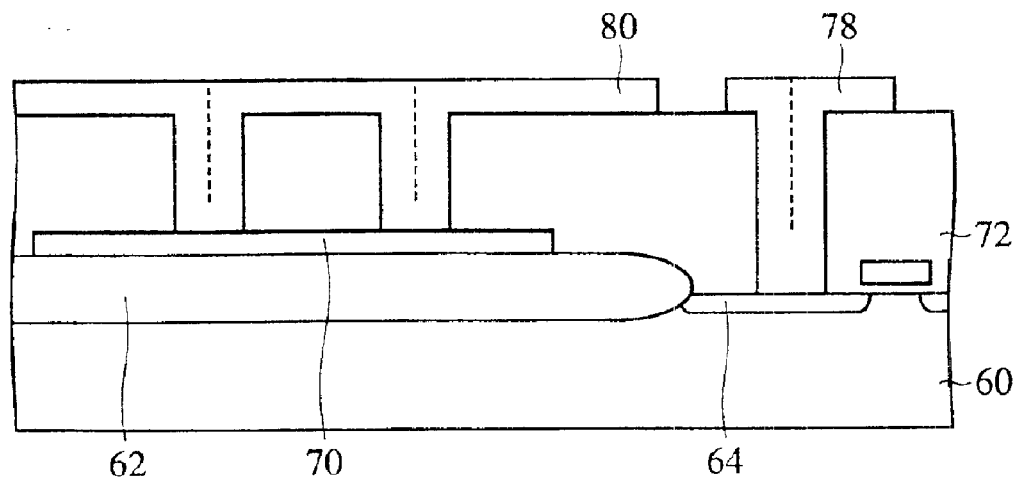

Then, the thus-formed tungsten film is patterned to form the interconnection layer 78 connected to the source/drain diffused layer 64, and the blocking layer 80 extended over the inter-layer insulation film 72 buried in the grooves 76 (FIG. 9C).

Then, the inter-layer insulation film 82 of silicon oxide film is formed by, e.g., CVD method on the inter-layer insulation film 72 with the interconnection layer 78 and the blocking layer 80 formed on.

Figure 10A:
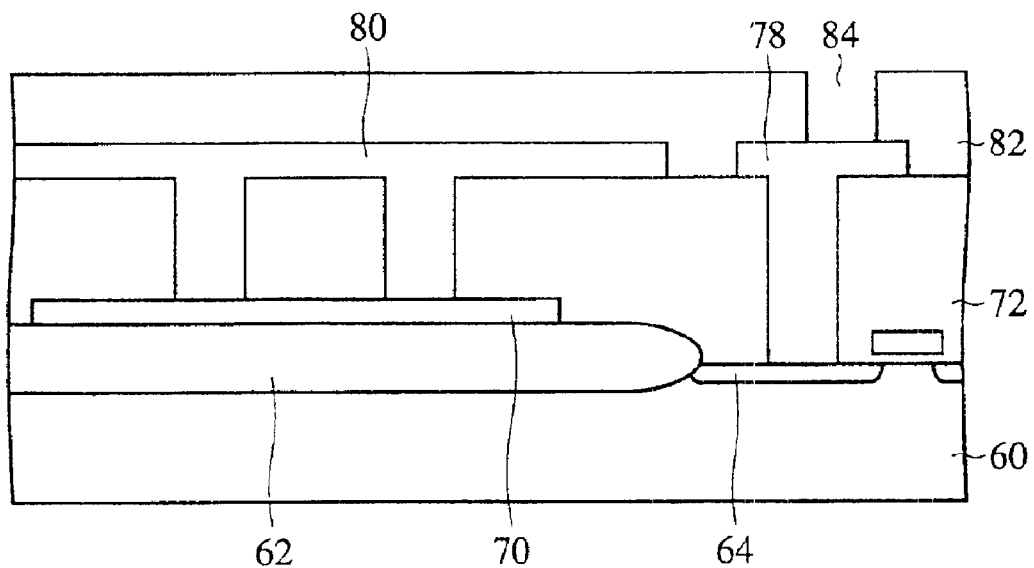

Then, the contact hole 84 which reaches the interconnection layer 78 is formed in the inter-layer insulation film 82 by the usual lithography and etching (FIG. 10A).

Figure 10B:
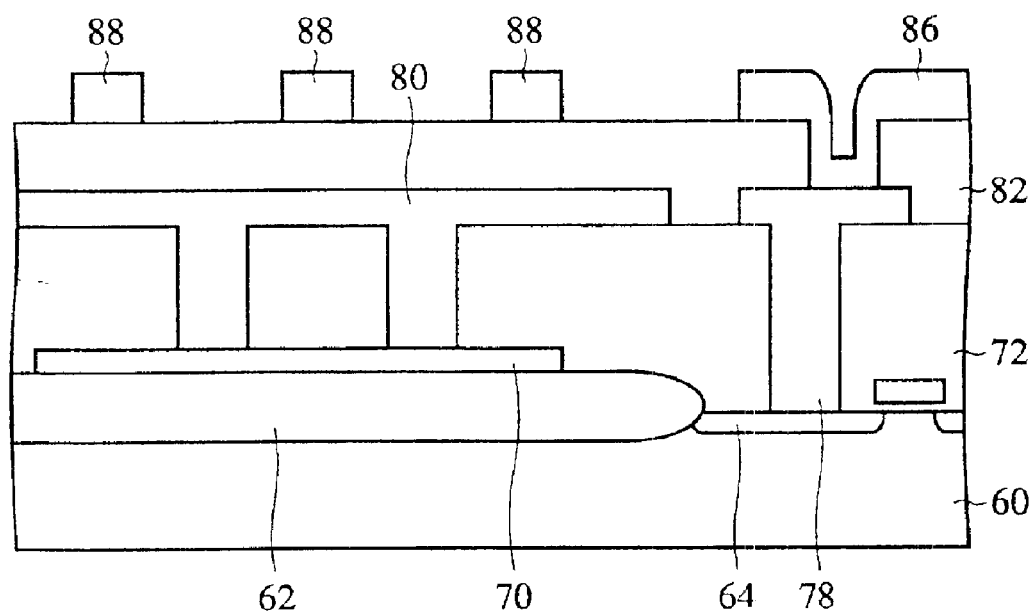

Then, a conducting layer including an aluminum alloy layer is formed on the entire surface by, e.g., sputtering method and patterned to form the interconnection layer 86 connected to the interconnection layer 78 through the contact hole 84, and the fuses 88 formed above the blocking layer 80 (FIG. 10B).

The semiconductor device is thus fabricated, whereby the blocking layer can be thicker in the spot regions where spots of laser beams for disconnecting the fuses 88 overlap each other, which allows a fuse pitch to be determined without considering an overlap of the spot regions.

As described above, according to the present embodiment, the grooves 76 are formed in the inter-layer insulation film 72 in the regions where the spot regions 90 of laser beams for disconnecting the fuses 88 overlap each other, and the blocking layer 80 is formed, filling the grooves 76 and extended over the inter-layer insulation film 72, whereby the blocking layer 80 can be thicker in the regions where the spot regions 90 of laser beams overlap each other. The blocking layer 80 and the interconnection layer 78 are common with each other, and the grooves 76 are formed simultaneously with opening of the contact hole 78, which does not complicate the conventional semiconductor device fabrication method.

[A Fifth Embodiment]

The semiconductor device according to a fifth embodiment of the present invention and the method for fabricating the same will be explained with reference to FIGS. 11, 12, 13A–13C and 14A–14B. The same members of the present embodiment as those of the semiconductor device according to the fourth embodiment are represented by the same reference numbers not to repeat or to simplify their explanation.

Figure 11:
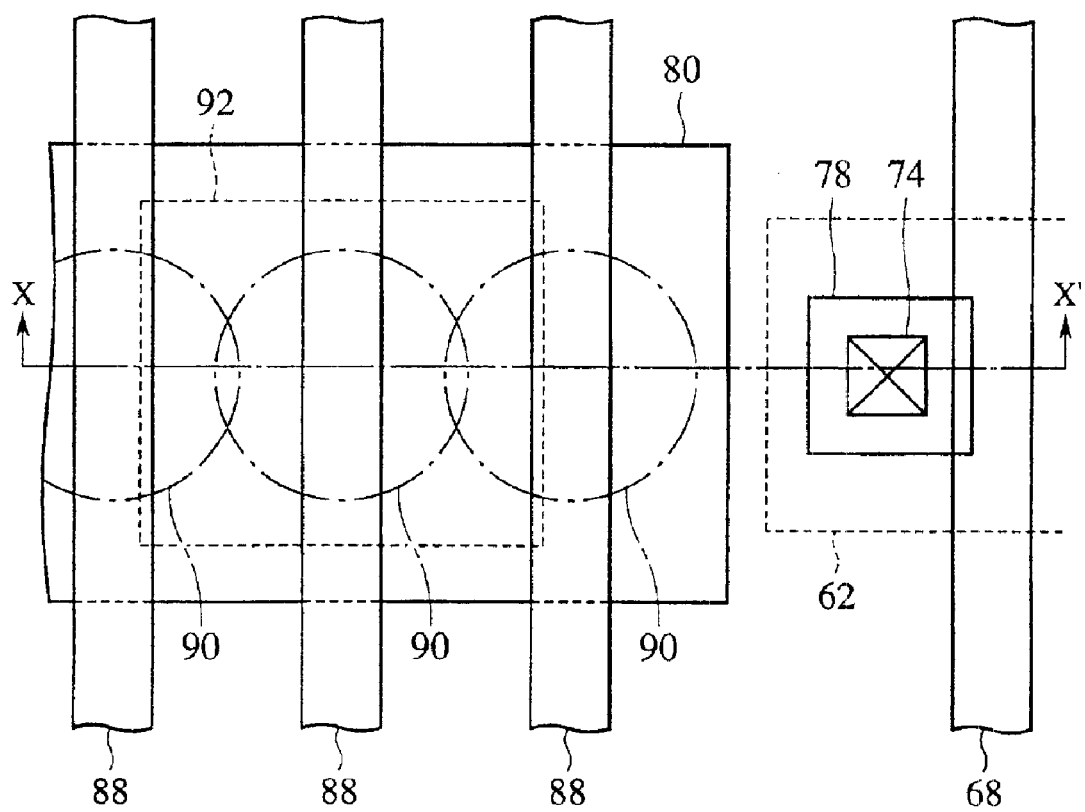
FIG. 11 is a plan view of the semiconductor device according to a fifth embodiment of the present invention, which shows a structure thereof.
Figure 12:
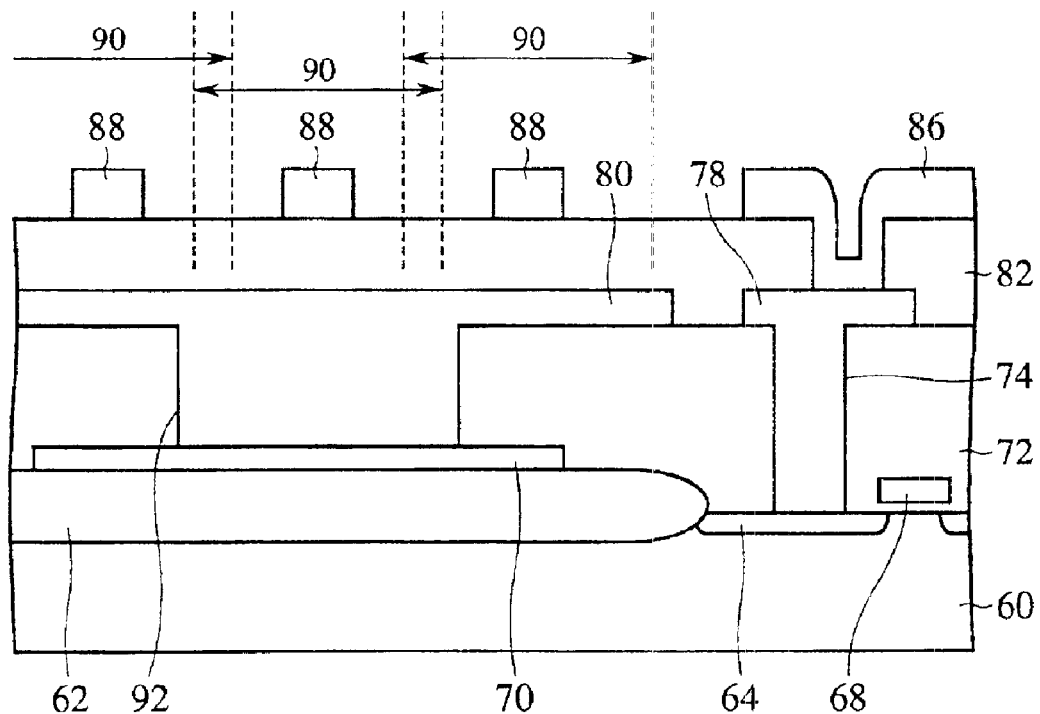
FIG. 12 is a diagrammatic sectional view of the semiconductor device according to the fifth embodiment of the present invention, which shows the structure thereof.

FIG. 11 is a plan view of the semiconductor device according to the present embodiment, which shows a structure thereof. FIG. 12 is a diagrammatic sectional view of the semiconductor device according to the present embodiment, which shows the structure thereof. FIGS. 13A–13C and 14A–14B are sectional views of the semiconductor device according to the present embodiment in the steps of the method for fabricating the same, which explain the method.

First, the structure of the semiconductor device according to the present embodiment will be explained with reference to FIGS. 11 and 12.

The semiconductor device according to the present embodiment is characterized in that a blocking layer for restraining laser ablation is formed of a thick film buried in an inter-layer insulation film 72. That is, in the inter-layer insulation film 72, there are formed a contact hole 74 which reaches a source/drain diffused layer 64, and an opening 92 which reaches a conducting layer 70, and an interconnection layer 78 connected to the source/drain diffused layer 64 through the contact hole 74, and the blocking layer 80 buried in the opening 92 and extended over the inter-layer insulation film 72 are formed on the inter-layer insulation film 72.

The thus-formed blocking layer 80 has a height corresponding to a film thickness of the inter-layer insulation film 72, and even in a case that spot regions of laser beams for disconnecting fuses 88 overlap each other, the laser ablation is prevented from arriving at the substrate. Accordingly, this structure of the semiconductor device prevents laser ablation from passing through the blocking layer 80 even when adjacent fuses 88 are disconnected, which allows a small fuse pitch without arranging the fuse disconnecting regions with staggered arrangement as in the second embodiment.

Then, the characteristic of the semiconductor device according to the present embodiment and the method for fabricating the same will be detailed in accordance with the steps of the semiconductor device fabrication method.

First, in the same way as in the semiconductor device according to, e.g., the fourth embodiment shown in FIGS. 9A and 9B, the inter-layer insulation film 72 is formed on the silicon substrate 60 with the MOS transistor, etc. formed on.

Figure 13A:
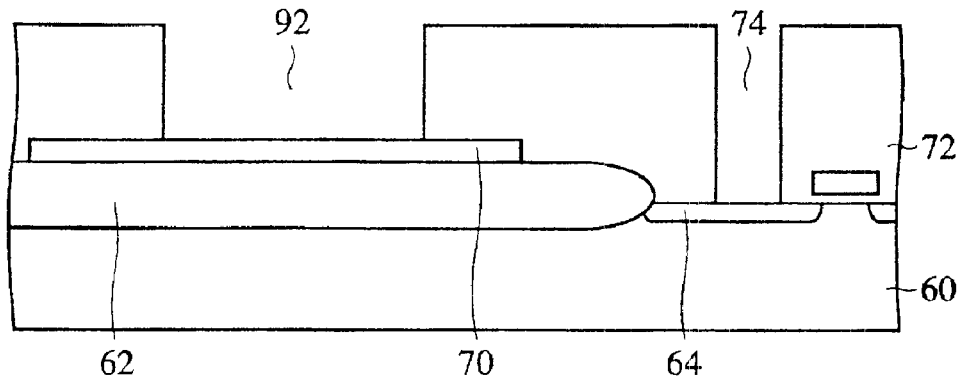
FIGS. 13A–13C and 14A–14B are sectional views of the semiconductor device according to the fifth embodiment of the present invention in the steps of the method for fabricating the same, which show the method.

Then, the contact hole 74 which reaches the source/drain diffused layer 64 and the opening 92 which reaches the conducting layer 70 are formed in the inter-layer insulation film 72 by the usual lithography and etching (FIG. 13A). The opening 92 is a region where the blocking layer 80 for restraining laser ablation is to be formed. The opening 92 is formed on a region where at least spot regions 90 of laser beams overlap each other.

Figure 13B:
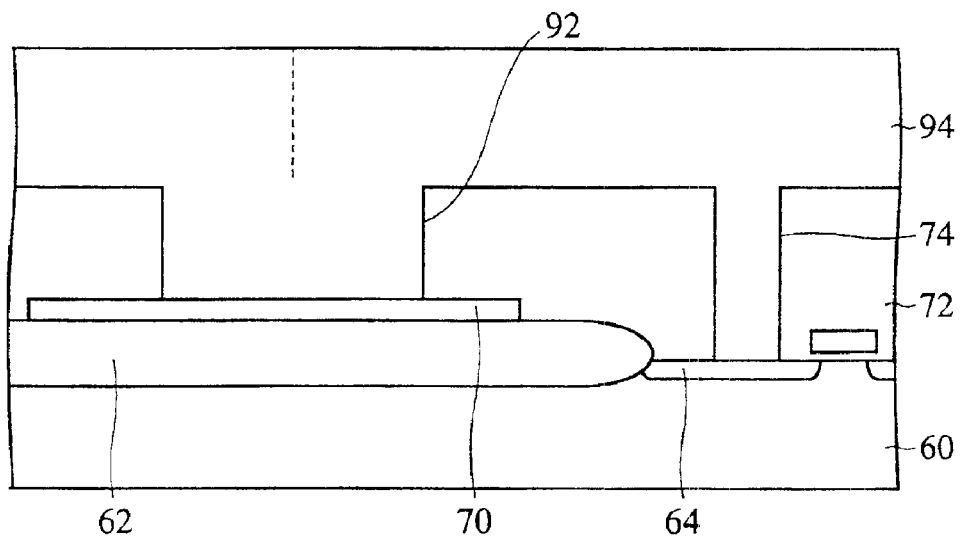

Then, a tungsten film 94 is deposited on the entire surface by, e.g., CVD method (FIG. 13B). It is preferable that the tungsten film 94 has a thickness sufficient to fully fill the opening 92. In the semiconductor device shown in FIG. 13B, for planarization, the tungsten film 94 is deposited so as to have a substantially flat surface, but may have a thickness which is sufficient at least to bury the contact hole 74 and to be extended as the interconnection layer over the inter-layer insulation film 72 and is sufficient to restrain laser ablation.

It is possible that an adhesion layer/contact layer of, e.g., a TiN film/Ti film is provided below the tungsten film.

Figure 13C:
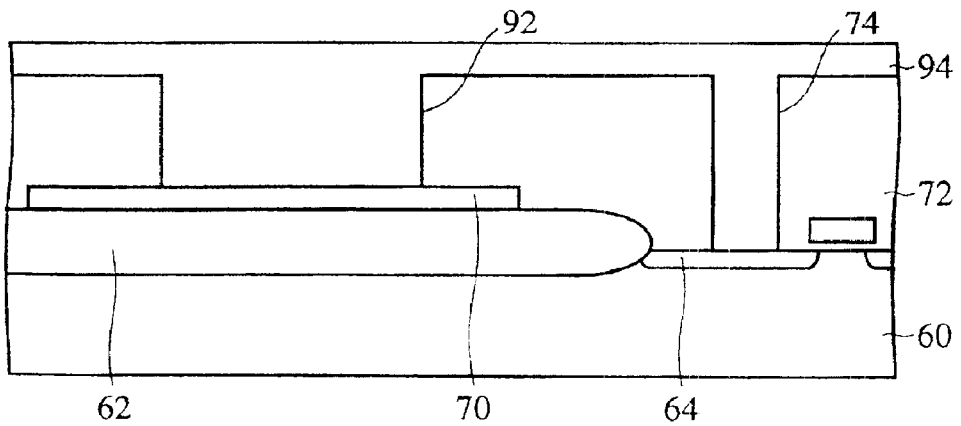

Then, the surface of thus-deposited tungsten film 94 is etched back or polished, whereby the tungsten film 94 on the inter-layer insulation film 72 has a thickness suitable as the interconnection layer (FIG. 13C).

Figure 14A:
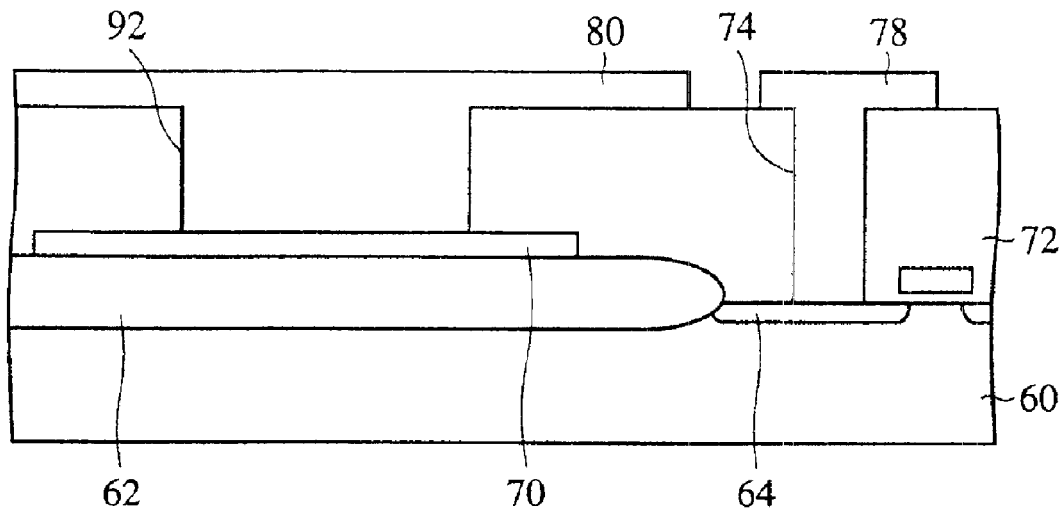

Next, the tungsten film 94 is patterned to form the interconnection layer 78 connected to the source/drain diffused layer 64 through the contact hole 74, and the blocking layer 80 extended over the inter-layer insulation film 72 buried in the opening 92 (FIG. 14A).

Figure 14B:
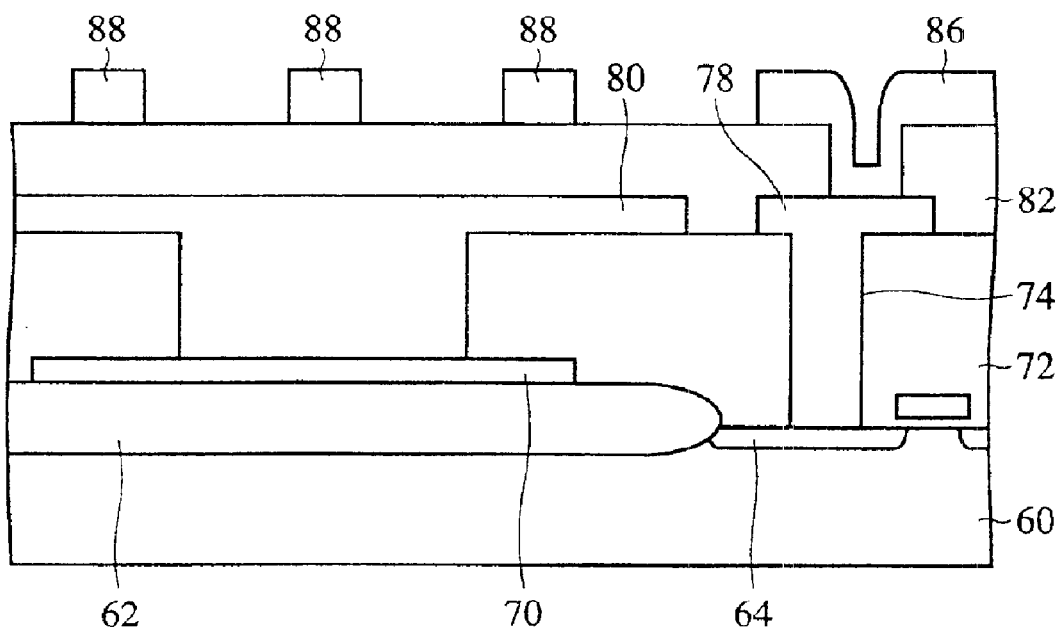

Subsequently, in the same way as in the semiconductor device according to, e.g., the fourth embodiment shown in FIGS. 10A and 10B, the fuses 88, the interconnection layer 86, etc. are formed (FIG. 14B).

The semiconductor device is thus fabricated, whereby the blocking layer 80 can be thick without much changing fabrication steps of the conventional semiconductor device. Accordingly, even in a case that spot regions 90 of laser beams for disconnecting the fuses 88 overlap each other, the blocking layer 80 can bear the laser ablation.

As described above, according to the present embodiment, the tungsten film to be the blocking layer 80 is buried in the opening 92 formed in the inter-layer insulation film 72 in the fuse forming region, whereby the blocking layer 80 can be thick without much changing the fabrication steps of the conventional semiconductor device. As a result, even in a case that spot regions 90 of laser beams for disconnecting the fuses 88 overlap each other, the blocking layer 80 can bear the laser ablation.

In the present embodiment, the blocking layer 80 is formed of the first metal interconnection layer, but the blocking layer may be formed of the interconnection layer which is more above.

It is not essential that the blocking layer is uninterrupted all over the fuse forming region and may be divided as the blocking layer of the third embodiment.

[A Sixth Embodiment]

The semiconductor device according to a sixth embodiment of the present invention and the method for fabricating the same will be explained with reference to FIGS. 15, 16A–16C and 17A–17C. The same members of the present embodiment as the semiconductor device according to the fourth or the fifth embodiments are represented by the same reference numbers not to repeat or to simplify their explanation.

Figure 15:
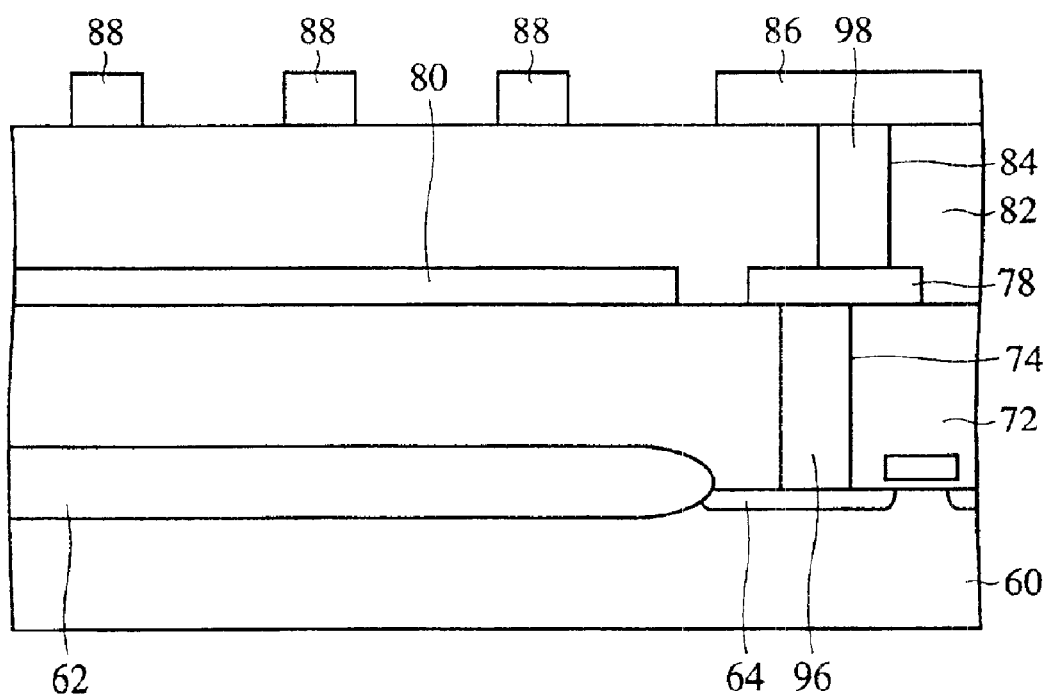
FIG. 15 is a diagrammatic sectional view of the semiconductor device according to a sixth embodiment of the present invention, which shows the structure thereof.

FIG. 15 is a diagrammatic sectional view of the semiconductor device according to the present embodiment, which shows a structure thereof. FIGS. 16A–16C and 17A–17C are sectional views of the semiconductor device in the steps of the method for fabricating the same, which show the method.

First, the structure of the semiconductor device according to the present embodiment will be explained with reference to FIG. 15.

A device isolation film 62 for defining a device region is formed on a silicon substrate 60. In the device region defined by the device isolation film 62, there is formed a MOS transistor constituted by a gate electrode 68 formed on the silicon substrate 60 through a gate insulation film 66 and a source/drain diffused layers 64 formed on both sides of the gate electrode 68. On the silicon substrate 60 with the MOS transistor, etc. formed on, there is formed an inter-layer insulation film 72 with a contact hole 74 which reaches the source/drain diffused layer 64 of the MOS transistor. A plug 96 is buried in the contact hole 74. On the inter-layer insulation film 72 in a fuse forming region, there are formed a blocking layer 80 of the same conducting layer as the plug 96, and an interconnection layer 78 connected to the plug 96. On the inter-layer insulation film 72 with the interconnection layer 78 and the blocking layer 80 formed on, there is formed an inter-layer insulation film 82 with a contact hole 84 formed in which reaches the interconnection layer 78. A plug 98 is buried in the contact hole 84. On the inter-layer insulation film 82, there are formed an interconnection layer 86 connected to the interconnection layer 78 through the plug 98, and fuses 88 of the same conducting layer as the interconnection layer 86 formed above the blocking layer 80.

The semiconductor device according to the present embodiment is characterized in that the plug 96 and the blocking layer 80 are formed of the same conducting layer. Recently in the semiconductor device, it is common that multi-layer metal interconnection layers of aluminum alloy layers are inter-connected with each other by a tungsten plug. If the blocking layer and the plug are formed of a common tungsten film, the plug layer can be formed without making changes to interconnecting materials and interconnecting structures. The present embodiment has taken this into consideration.

Next, the characteristic of the semiconductor device according to the present embodiment and the method for fabricating the same will be explained in accordance with the steps of the fabrication method.

First, in the same way as in the semiconductor device according to, e.g., the fourth embodiment shown in FIGS. 9A and 9B, an inter-layer insulation film 72 is formed on a silicon substrate 60 with the MOS transistor, etc. formed on.

Figure 16A:
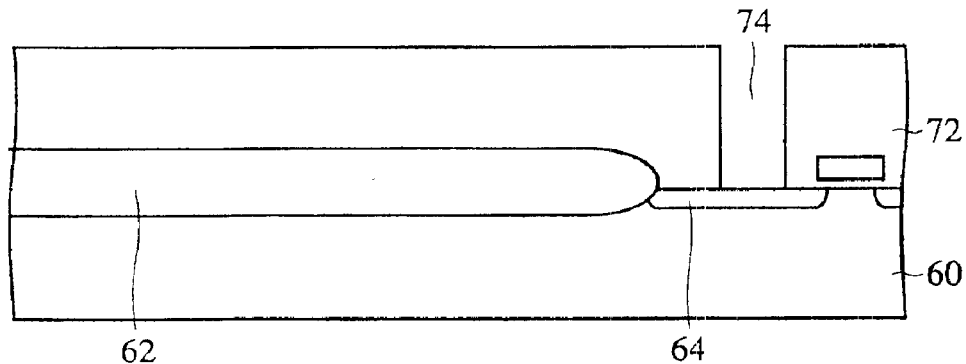
FIGS. 16A–16C and 17A–17C are sectional views of the semiconductor device according to the sixth embodiment of the present invention in the steps of the method for fabricating the same, which show the method.

Then the contact hole 74 which reaches the source/drain diffused layer 64 is formed in the inter-layer insulation film 72 by the usual lithography and etching (FIG. 16A).

Subsequently a tungsten film 94 is formed on the entire surface by CVD method. The tungsten film 94 is deposited in a thickness which is more than a half a diameter of an opening of the contact hole 74, whereby the contact hole 74 is filled with the tungsten film 94. A contact layer of, e.g., a TiN film/Ti film may be provided below the tungsten film 94.

Figure 16B:
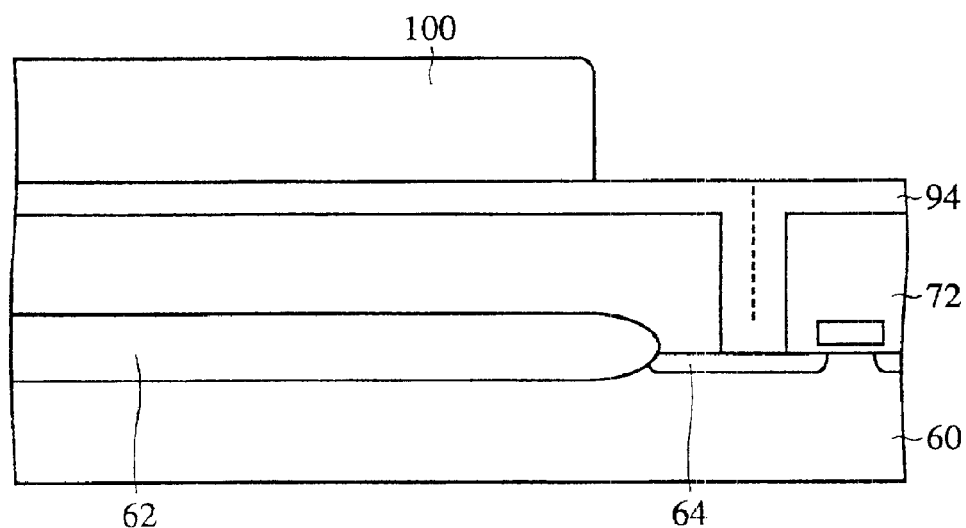

Then, a photoresist 100 is formed by the usual lithography in a region where the blocking layer 80 is to be formed (FIG. 16B). In the semiconductor device shown in FIG. 16B, the photoresist 100 is formed to form the blocking layer 80 in one uninterrupted body but may be formed to form the blocking layer 80 divided for respective fuses as in the third embodiment.

Figure 16C:
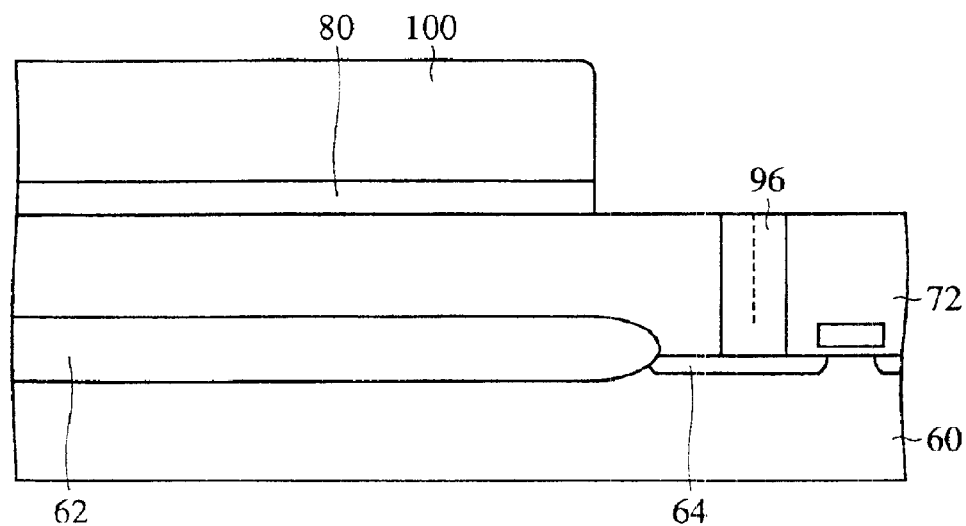

Next, the tungsten film 94 is etched back to form the plug 96 buried in the contact hole in the same way as the usual tungsten plug forming method. At this time, the photoresist 100 functions as a mask for the etching, and =accordingly the tungsten film 94 remain as in the region where the photoresist 100 is formed. The blocking layer 80 of the tungsten film 94 is formed concurrently with the plug 96 (FIG. 16C).

Figure 17A:
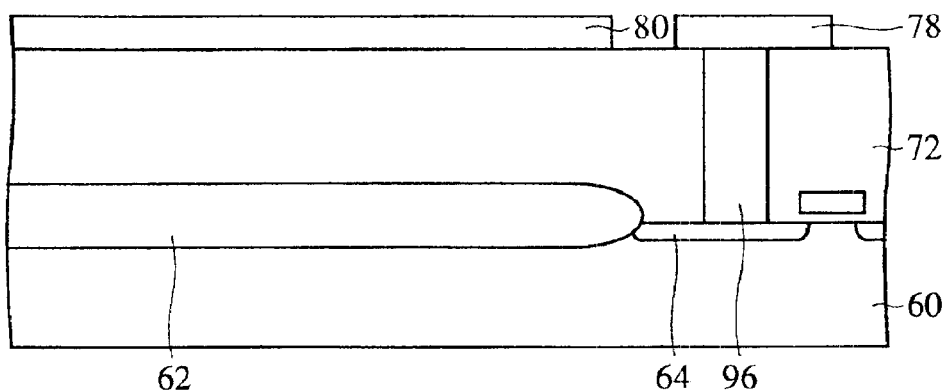

Subsequently, after the photoresist 100 is removed, a conducting layer containing, e.g., an aluminum alloy layer is deposited on the inter-layer insulation film 72 with the plug 96 and the blocking layer 80 formed on and patterned to form the interconnection layer 78 connected to the silicon substrate 60 through the plug 96 (FIG. 17A).

Then, the inter-layer insulation film 82 is formed on the inter-layer insulation film 72 with the interconnection layer 78 and the blocking layer 80 formed on.

Next, the contact hole 84 which reaches the interconnection layer 78 is formed in the inter-layer insulation film 82.

Figure 17B:
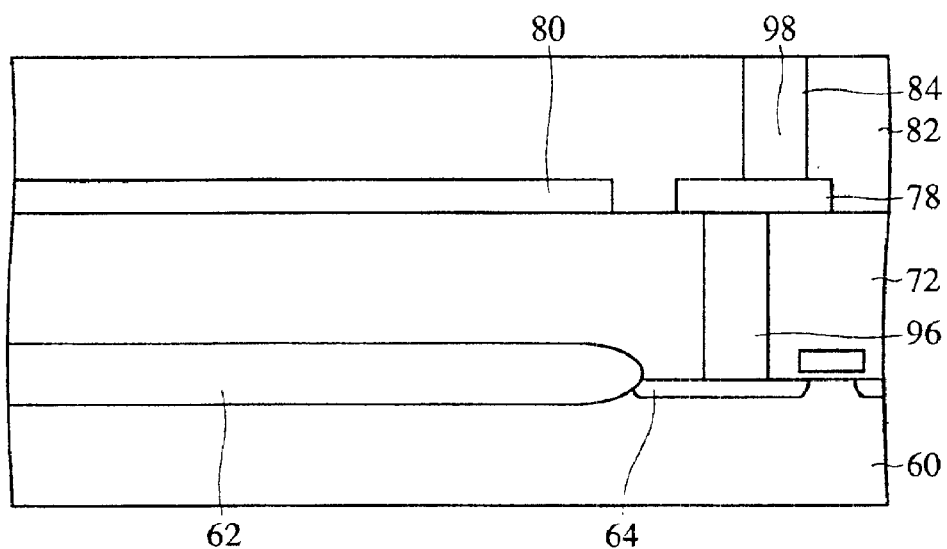

Subsequently, a tungsten film, for example, is deposited on the entire surface and etched back to form the plug 98 buried in the contact hole 84 (FIG. 17B).

Figure 17C:
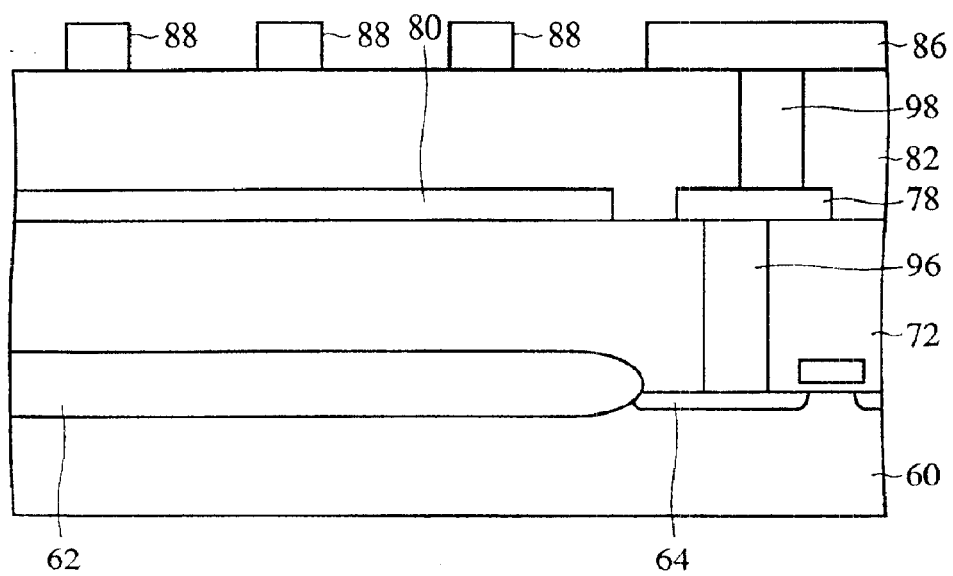

Then, a conducting layer containing, e.g., an aluminum alloy layer is deposited on the inter-layer insulation film 82 with the plug 98 buried in and patterned to form the interconnection layer 86 connected to the interconnection layer 78 through the plug 98, and the fuses 88 formed above the blocking layer 80 (FIG. 17C).

Thus, a fuse circuit including the fuses 88 of the conducting layer containing the aluminum alloy layer, and the blocking layer 80 of the tungsten film can be formed.

As described above, according to the present embodiment, the addition of only one step that is the lithography step of forming the photoresist for leaving the blocking layer 80 enables the blocking layer to be readily formed, whereby the fuses 88 which are disconnectable by laser ablation can be formed without much changing a structure of the conventional device and a method for fabricating the same.

[A Seventh Embodiment]

The semiconductor device according to a seventh embodiment and the method for fabricating the same will be explained with reference to FIGS. 18 and 19A–19B. The same members of the present embodiment as those of the semiconductor device according to the fourth to the sixth embodiments are represented by the same reference numbers not to repeat or to simplify their explanation.

Figure 18:
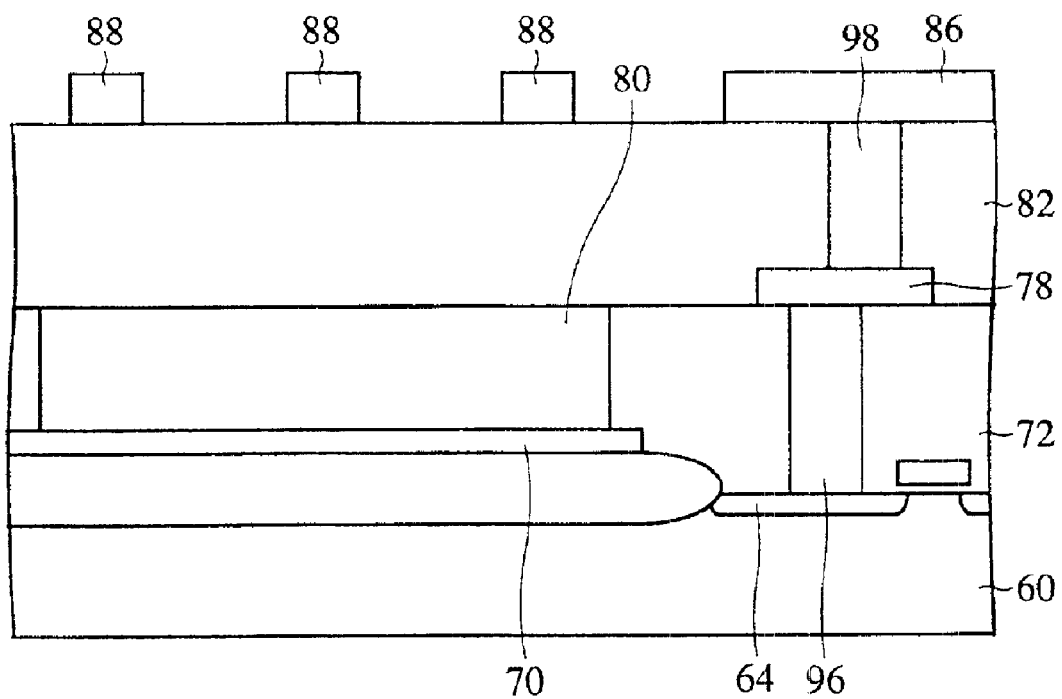
FIG. 18 is a diagrammatic sectional view of the semiconductor device according to a seventh embodiment of the present invention, which shows the structure thereof.

FIG. 18 is a diagrammatic sectional view of the semiconductor device according to the present embodiment, which shows the structure. FIGS. 19A–19B are sectional views of the semiconductor device in the steps of the method for fabricating the same, which show the method.

Then, the structure of the semiconductor device according to the present embodiment will be explained with reference to FIG. 18.

The semiconductor device according to the present embodiment is characterized in that a blocking layer 80 for restraining laser ablation is formed on the same conducting layer as a plug 96 buried in an inter-layer insulation film 72. The thus-formed blocking layer 80 has a height corresponding to a film thickness of the inter-layer insulation film 72, and even in a case that spot regions 90 of laser beams for disconnecting fuses 88 overlap each other, laser ablation can be prohibited from reaching the substrate. The semiconductor device has such structure, whereby even in a case fuses 88 adjacent to each other are disconnected, the laser ablation does not pass through the blocking layer 80. Accordingly, a small fuse pitch can be used without arranging the fuse disconnecting regions with staggered arrangement as in the second embodiment.

Next, the characteristic of the semiconductor device and the method for fabricating the same according to the present embodiment will be explained in accordance with the steps of the method for fabricating the same.

First, in the same way as in the method for fabricating the semiconductor device according to, e.g., the fifth embodiment the thick tungsten film 94 for burying the opening 92 and the contact hole 74 is formed. In the semiconductor device according to the present embodiment, the spot regions 90 of laser beams are positioned in the opening 92.

Figure 19A:
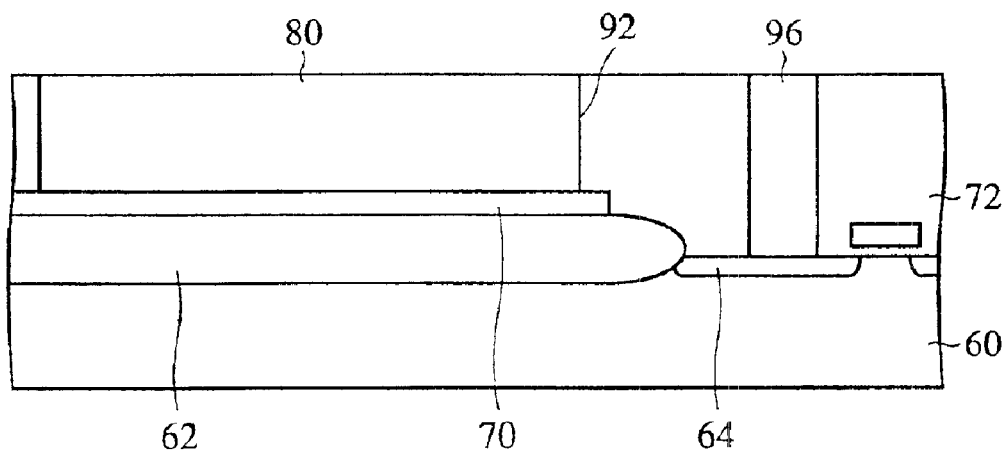
FIGS. 19A–19B are sectional views of the semiconductor device according to the seventh embodiment of the present invention in the steps of the method for fabricating the same, which show the method.

Then, in the same way as in the usual tungsten plug forming step, the tungsten film 94 is etched back or polished to form the blocking layer 80 buried in the opening 92, and the plug 96 buried in the contact hole 74 (FIG. 19A).

Figure 19B:
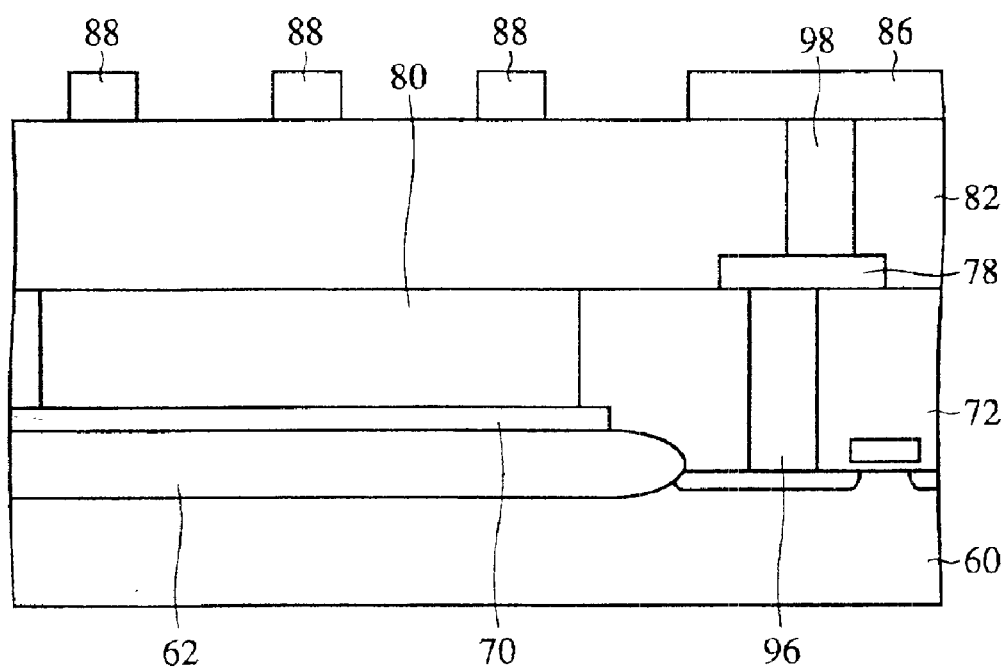

Subsequently, in the same way as in the method for fabricating the semiconductor device according to, e.g., the sixth embodiment shown in FIGS. 17B and 17C, the inter-connection layer 78 connected to the plug 96, the inter-layer insulation film 82, the plug 98, the interconnection layer 86, the fuses 88, etc. are formed (FIG. 19B).

The semiconductor device is thus fabricated, whereby the blocking layer 80 can be thick without much changing the conventional semiconductor device fabrication steps. As a result, even in a case that the spot regions 90 of laser beams for disconnecting the fuses overlap each other, the blocking layer 80 can bear the laser ablation.

Figure 20:
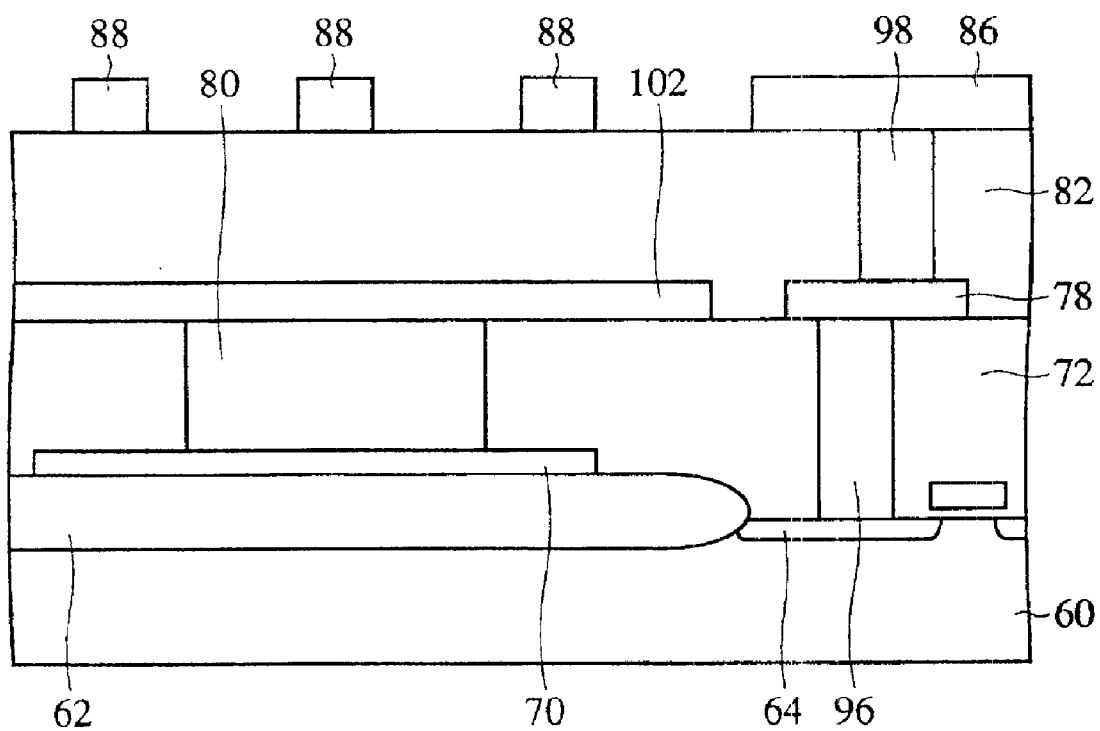
FIG. 20 is a sectional view of the semiconductor device according to a modification of the seventh embodiment of the present invention, which shows the structure and the method.

In the present embodiment, the interconnection layer 78 on the plug 96 is formed of an aluminum alloy layer but may be formed of a tungsten film. In the latter case, as shown in FIG. 20, it is possible that a tungsten film 102 of the same conducting layer as the interconnection layer 78 can be left also on the blocking layer 80. In this case, the tungsten film 102 also functions as the blocking layer, and the opening 92 in the inter-layer insulation film 72 may be formed at least only in a region where the spot regions 90 of laser beams overlap each other.

[An Eighth Embodiment]

The semiconductor device and the method for fabricating the same according to an eighth embodiment of the present invention will be explained with reference to FIGS. 21A–21B, 22A–22C and 23A–23B. The same members of the present embodiment as those of the semiconductor device according to the fourth to the seventh embodiments are represented by the same reference numbers not to repeat or to simplify their explanation.

Figure 21A:
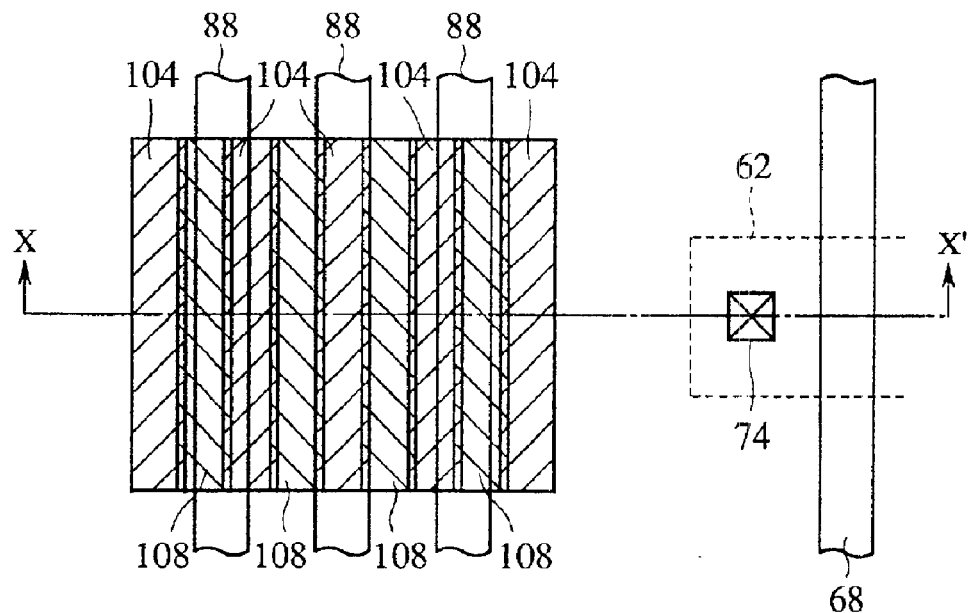
FIG. 21A is a plan view of the semiconductor device according to an eighth embodiment of the present invention, which shows the structure thereof.
Figure 21B:
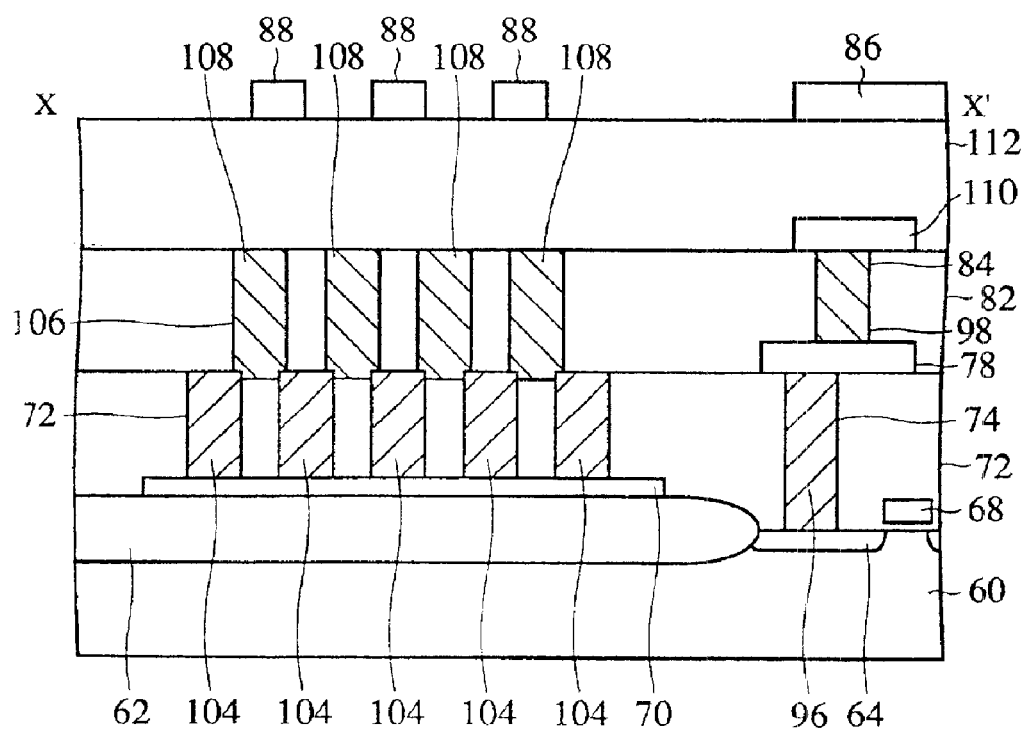
FIG. 21B is a diagrammatic sectional view of the semiconductor device according to the eighth embodiment of the present invention, which shows the structure thereof.

FIG. 21A shows a plan view of the semiconductor device according to the present embodiment, which show a structure thereof. FIG. 21B shows a sectional view of the semiconductor device according to the present embodiment, which show a structure thereof. FIGS. 22A–22C and 23A–23B are sectional views of the semiconductor device according to the present embodiment in the steps of the method for fabricating the same, which show the method.

First, the structure of the semiconductor device according to the present embodiment will be explained with reference to FIGS. 21A and 21B.

The semiconductor device according to the present embodiment is characterized in that a blocking layer for restraining laser ablation is formed of a striped blocking layer buried in one inter-layer insulation film, and a striped blocking layer buried in another inter-layer insulation film.

That is, on a silicon substrate 60 with a MOS transistor, etc. formed on, there is formed an inter-layer insulation film 72 in which are formed a contact hole 74 which reaches a source/drain diffused layers 64 of the MOS transistor, and striped grooves 76 which reach a conducting layer 70. A plug 96 of tungsten film is buried in the contact hole 74. The tungsten film of the same conducting layer as the plug 96 is buried in the striped grooves 76 to form a striped blocking layer 104. On the inter-layer insulation film 72 with the plug 96 and the blocking layer 104 buried in, there is formed an interconnection layer 78 connected to the plug 96. On the inter-layer insulation film 72 with the interconnection layer 78 formed on, there are formed a contact hole 84 which reaches the interconnection layer 78, and striped grooves 106 which reach regions between each of the divided portions of the blocking layer 104 and its adjacent portion. A plug 98 of tungsten film is buried in the contact hole 84, and the tungsten film of the same conducting layer as the plug 98 is buried in the grooves 106, and a striped blocking layer 108 is formed. The blocking layer 104 and the blocking layer 108 are uninterrupted as viewed in a plan layout (FIG. 21A). On the inter-layer insulation film 84, there are formed an interconnection layer 110 connected to the interconnection layer 78 through the plug 98. An inter-layer insulation film 112 is formed on the inter-layer insulation film 82 with the interconnection layer 110 formed on. On the inter-layer insulation film 112, there are formed an interconnection layer 86, and fuses 88 formed of the same conducting layer as the interconnection layer 86 and formed above the blocking layers 104, 108.

The thus-formed blocking layers 104, 108 have sufficient heights corresponding to film thicknesses of the inter-layer insulation films 72, 82, and accordingly even in a case that spots of laser beams for disconnecting the fuses 88 overlap each other, the laser ablation is prevented from arriving at the substrate. This structure of the semiconductor device does not permit, even when those of the fuses 88 adjacent to each other are disconnected, the laser ablation to pass through the blocking layers 104, 108. Accordingly, it is not necessary to arrange the fuse disconnecting regions with staggered arrangement as in the second embodiment, and a small fuse pitch can be used.

Next, the characteristic of the semiconductor device and the method for fabricating the same according to the present embodiment will be detailed in accordance with the steps of the semiconductor device fabrication method.

First, in the same way as in the method for fabricating the semiconductor device according to, e.g., the fourth embodiment shown in FIG. 9C, a MOS transistor, etc. are formed on a silicon substrate 60.

Next, the inter-layer insulation film 72 of silicon oxide film is formed on the entire surface by, e.g., CVD method.

Figure 22A:
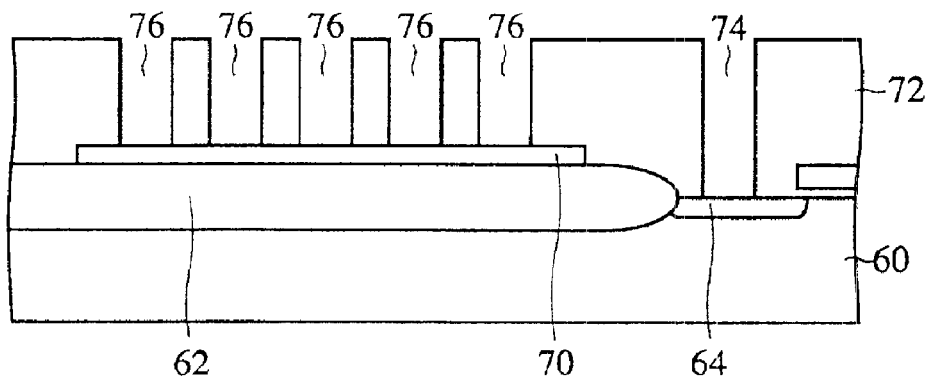
FIGS. 22A–22C and 23A–23B are sectional views of the semiconductor device according to the eighth embodiment of the present invention in the steps of the method for fabricating the same, which show the method.
Figure 22B:
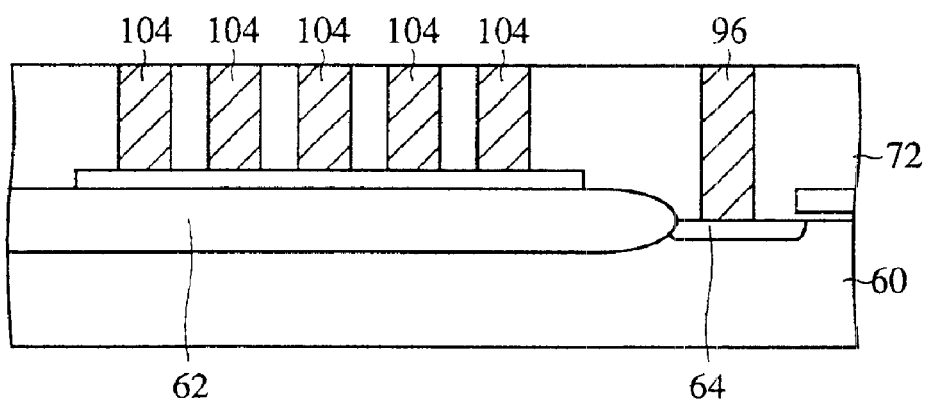

Subsequently, the contact hole 74 which reaches a source/drain diffused layer 64 and striped grooves 76 which reach the conducting layer 70 are formed in the inter-layer insulation film 72 (FIG. 22A). A width of the grooves 76 is made substantially equal to a diameter of the contact hole 74, whereby a tungsten film is deposited in a film thickness which is necessary to form the plug 96 in a later step, and thereby the tungsten film can be fully filled also in the grooves 76. The semiconductor device can be fabricated without much changing fabrication conditions of the conventional semiconductor device.

Then, a tungsten film is deposited on the entire surface by, e.g., CVD method. A contact layer of, e.g., TiN film/Ti film may be provided below the tungsten film.

Then, the thus-deposited tungsten film is etched back to remain the tungsten film only in the contact hole 74 and the grooves 76. The plug 96 thus buried in the contact hole 74, and the blocking layer 104 buried in the striped grooves 76 are formed (FIG. 22C).

Subsequently, the conducting layer containing an aluminum alloy layer on the entire surface by, e.g., sputtering method and patterned to form the interconnection layer 78 connected to the source/drain diffused layer 64 through the plug 96.

Then, the inter-layer insulation film 82 of silicon oxide film is formed by, e.g., CVD method on the inter-layer insulation film 72 with the interconnection layer 78 formed on.

Figure 22C:
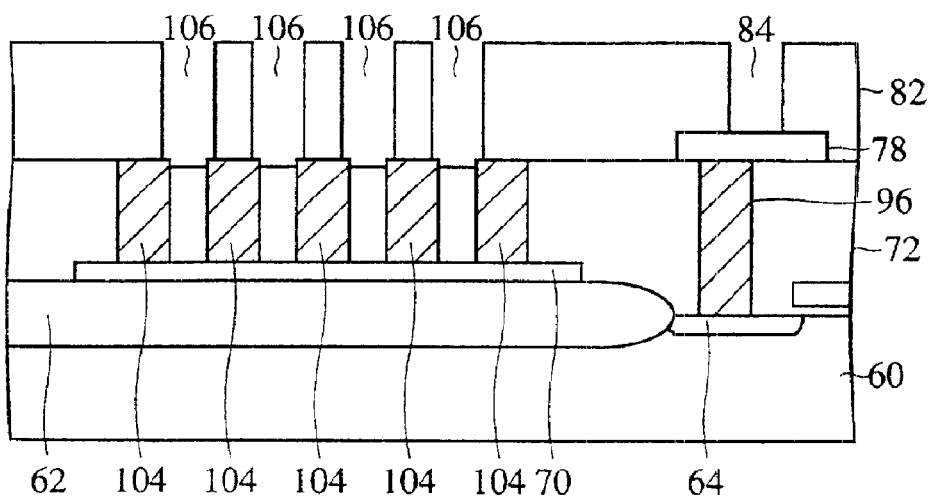

Next, the contact hole 84 which arrives at the interconnection layer 78, the striped grooves 106 which expose the inter-layer insulation film 72 in regions between each portion of the divided blocking layer 104 and its adjacent portion are formed in the inter-layer insulation film 82 (FIG. 22C). A width of the grooves 106 is made substantially equal to a diameter of the contact hole 84, whereby the tungsten film is deposited in a film thickness necessary to form the plug 98 in the later step, and thereby the tungsten film can be fully filled in the grooves 106. The semiconductor device can be fabricated without changing fabrication conditions of the conventional semiconductor device. Preferably the grooves 106 are formed to expose the edges of the portions of the blocking layer 104.

Subsequently, a tungsten film is deposited on the entire surface by, e.g., CVD method. A contact layer of, e.g., a TiN film/Ti film may be provided below the tungsten film.

Figure 23A:
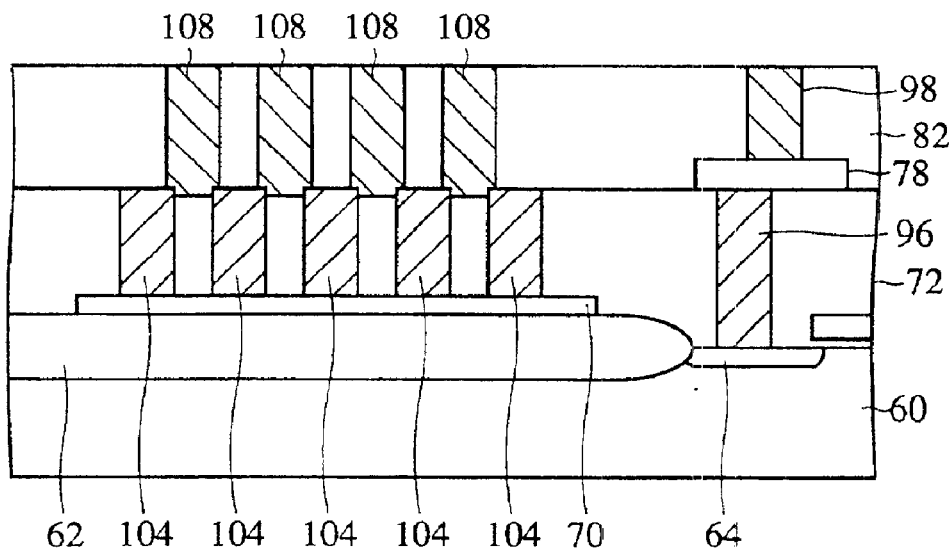
Figure 23B:
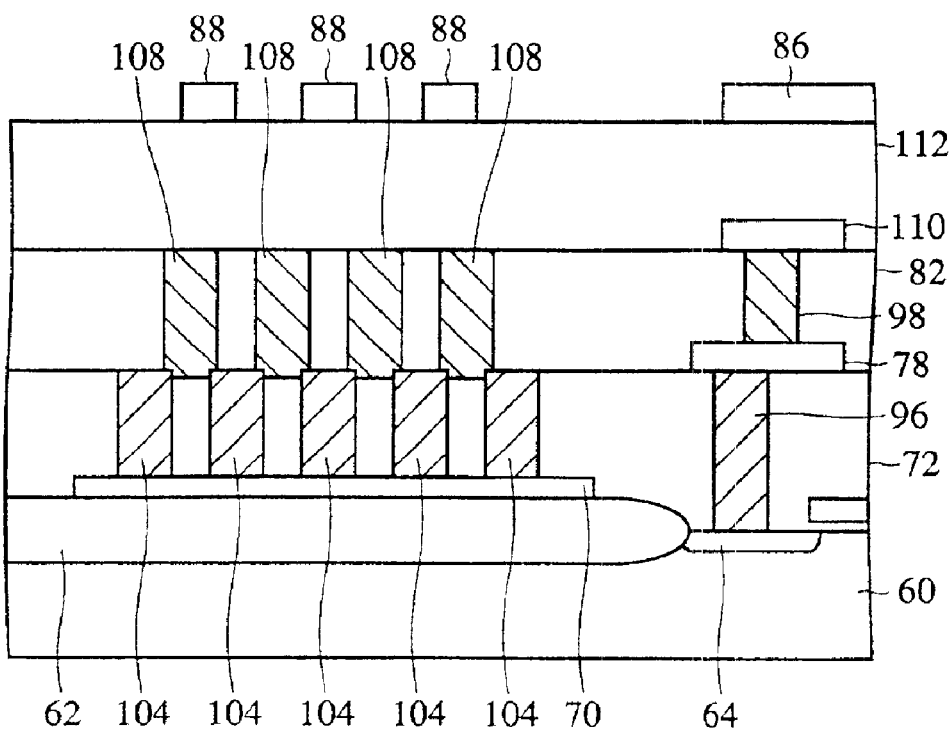

Then, the thus-deposited tungsten film is etched back to leave the tungsten film only in the contact hole 84 and the grooves 106. Thus, the plug 98 buried in the contact hole 84 and the blocking layer 108 buried in the striped grooves 106 are formed (FIG. 23A).

The blocking layers 104, 108 are thus formed, whereby the blocking layers 104, 108 are uninterrupted as viewed in a plan layout (see FIG. 21A), whereby the blocking layer 104 and/or the blocking layer 108 can restrain the laser ablation.

Next, the conducting layer containing an aluminum alloy layer is formed on the entire surface by, e.g., sputtering method and patterned to form the interconnection layer 110 connected to the interconnection layer 78 through the plug 98.

Subsequently, the inter-layer insulation film 112 of silicon oxide film is formed by, e.g., CVD method on the inter-layer insulation film 82 with the interconnection layer 110 formed on.

Then, the interconnection layer containing an aluminum alloy layer is formed on the entire surface by, e.g., sputtering method and patterned to form the interconnection layer 86, and the fuses 88 formed above the blocking layers 104, 108.

The semiconductor device is thus fabricated, whereby the blocking layers which can bear the laser ablation even in a case that spots of laser beams for disconnecting the fuses overlap each other can be formed without changing the conventional semiconductor device fabrication method.

As described above, according to the present embodiment, the two striped blocking layers 104, 108 which are formed concurrently with the plugs 96, 98 are arranged in an uninterrupted blocking layer as viewed in a plan layout, whereby the blocking layers which can bear, even in a case that spots of laser beams for disconnecting the fuses overlap each other, the laser ablation can be formed.

Figure 24A:
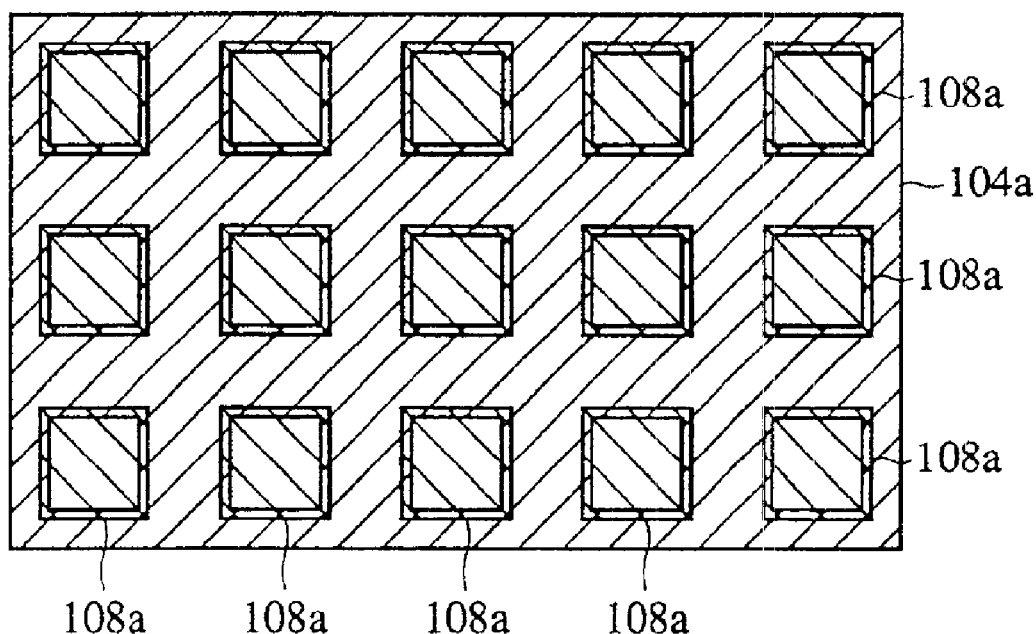
FIGS. 24A and 24B are plan views of the semiconductor device according to modifications of the eight embodiment, which shows a structure thereof.
Figure 24B:
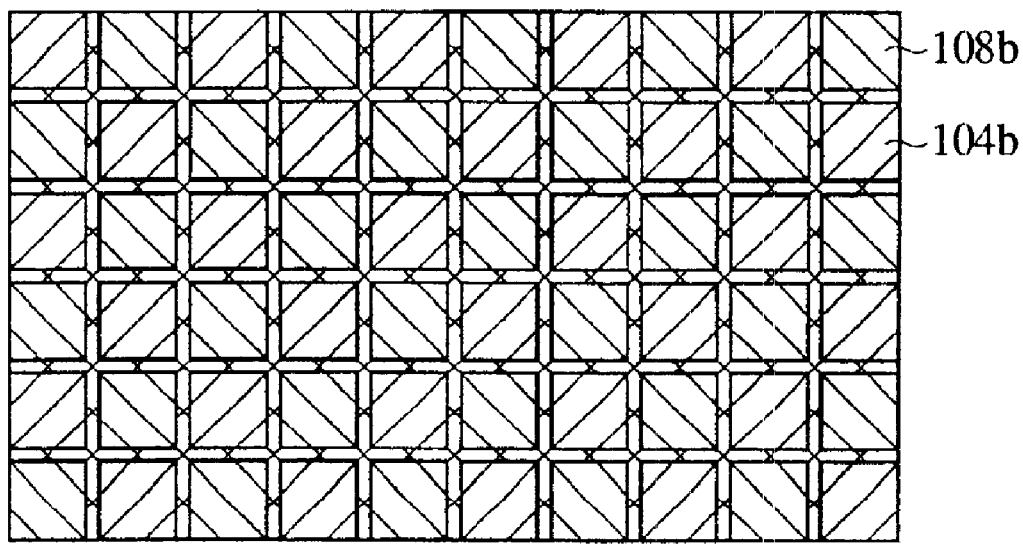
Figure 25A:
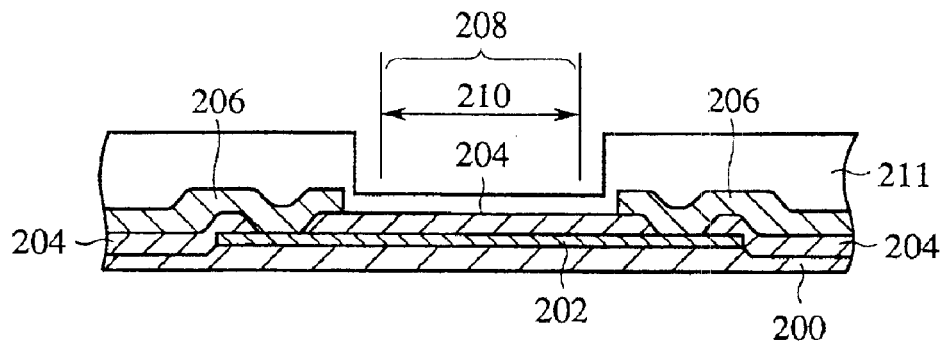
FIGS. 25A–25C are diagrammatic views of a conventional semiconductor device, which show a structure thereof and a method for fabricating the same.
Figure 25B:
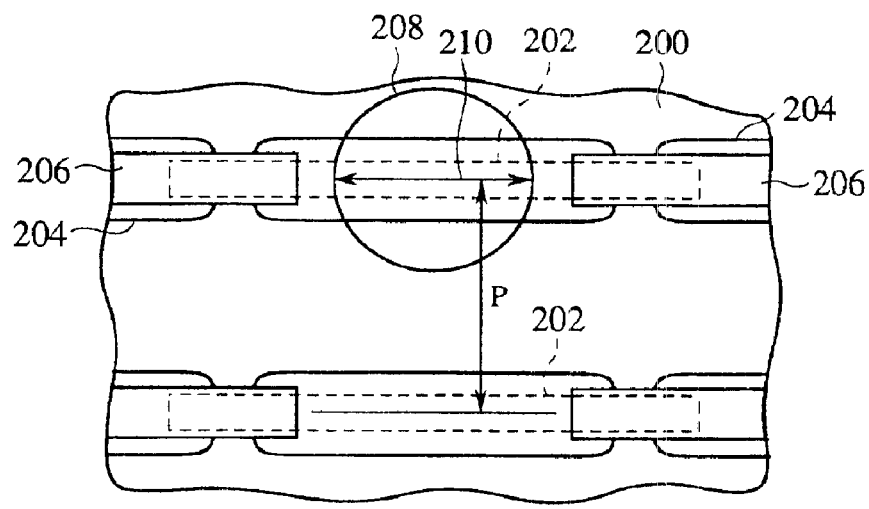
Figure 25C:
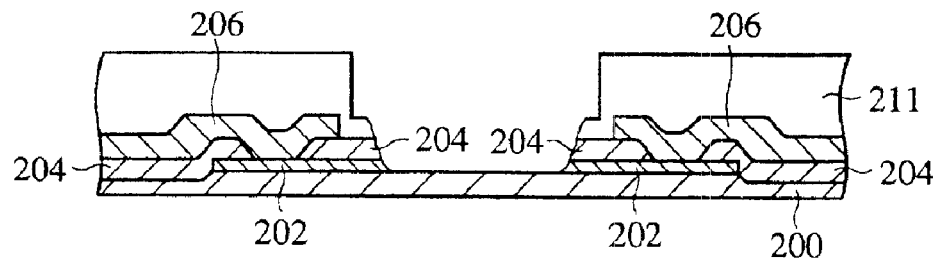
Figure 26A:
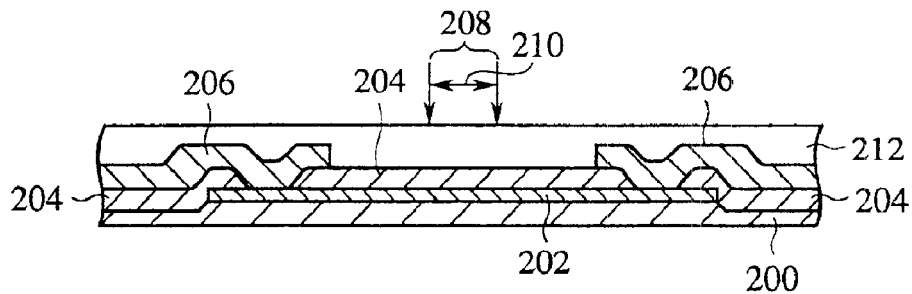
FIGS. 26A–26D are diagrammatic views of a conventional semiconductor device, which show a structure thereof and a method for fabricating the same.
Figure 26B:
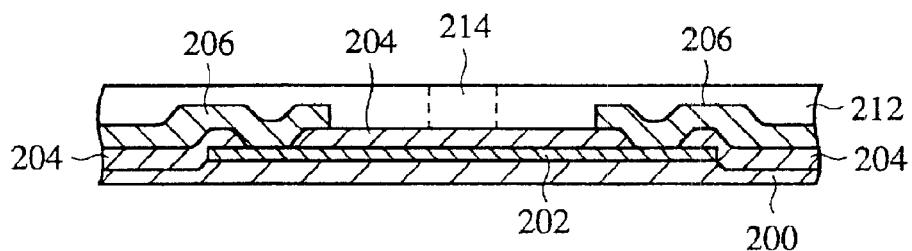
Figure 26C:
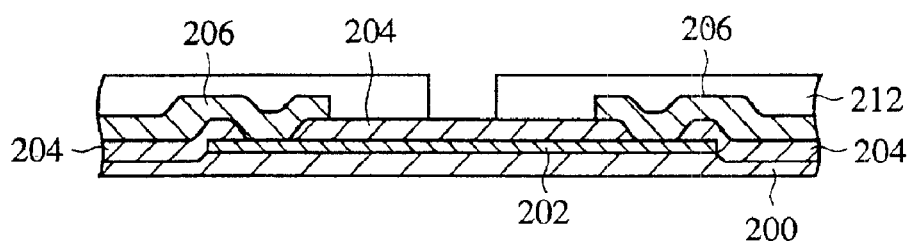
Figure 26D:
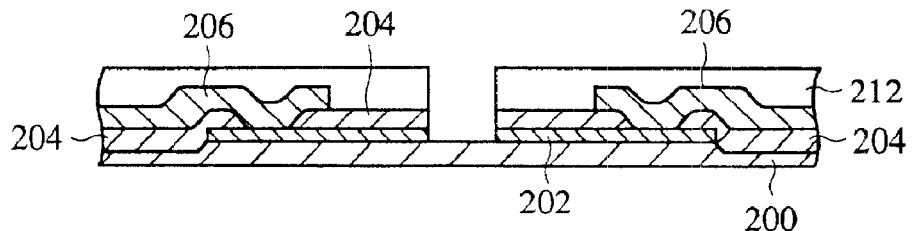

In the present embodiment, the blocking layers 104, 108 are striped, but they are not essentially striped. As exemplified in FIG. 24A, two mesh-like blocking layers 104a, 108a may be arranged in an uninterrupted blocking layer as viewed in a plan layout. As exemplified in FIG. 24B, two mesh-like blocking layers 104b, 108b may be arranged in an uninterrupted blocking layer as viewed in a plan layout. The blocking layers 104, 108 may have any patterns as long as the patterns can be filled simultaneously with filling the plugs 96, 98.

In a semiconductor device including plugs of three or more layers, the blocking layers may be formed of any two layers of the three or more layers, and the plugs of the three or more layers are arranged in an uninterrupted blocking layer as viewed in a plan layout.

The blocking layers are not formed necessarily continuous over the fuse forming regions and may be formed in the arrangement of the third embodiment.

What is claimed is:

1. A method for fabricating a semiconductor device comprising the steps of:

forming on a substrate a first insulation film having a contact hole which reaches the substrate;

depositing a first conducting film on the first insulation film and patterning the same to form a first interconnection layer connected to the substrate through the contact hole and formed of the first conducting film, and a blocking layer formed of the first conducting film;

forming a second insulation film on the first insulation film with the first interconnection layer and the blocking layer formed on the first insulation film; and depositing a second conducting film on the second insulation film and patterning the same to form a second interconnection layer formed of the second conducting film, and a fuse formed above the blocking layer and formed of the second conducting film.

2. A method for fabricating the semiconductor device according to claim 1, wherein in the step of forming the first insulation film, an opening which reaches the substrate is further formed in the first insulation film in a region where irradiation regions of laser beams for disconnecting the fuses overlap each other, and in the step of forming the first interconnection layer and the blocking layer, the blocking layer is formed, buried in the opening and extended over the first insulation film.

3. A method for fabricating the semiconductor device comprising the steps of:

forming on a substrate a first insulation film having a contact hole which reaches the substrate formed in;

forming a plug buried in the contact hole and formed of a first conducting film, and a blocking layer on the first insulation film and formed of the first conducting film;

forming a second insulation film on the first insulation film with the plug and the blocking layer formed on; and depositing a second conducting film on the second insulation film and patterning the same to form an interconnection layer formed of the second conducting film, and a fuse formed above the blocking layer and formed of the second conducting film.

4. A method for fabricating the semiconductor device according to claim 3, wherein in the step of forming the plug and the blocking layer, the first conducting film is formed on the first insulation film, a photoresist is formed on the first conducting film in a region where the blocking layer is to be formed, and the first conducting film is etched back with the photoresist as a mask, whereby the plug buried in the contact hole, and the blocking layer formed on the first insulation film are formed.

5. A method for fabricating the semiconductor device according to claim 3, wherein in the step of forming the first insulation film, an opening which reaches the substrate is further formed in the first insulation film in a region where the blocking layer is to be formed, and in the step of forming the plug and the blocking layer, the first conducting film is formed on the fist insulation film, and the first conducting film is etched back, whereby the plug buried in the contact hole, and the blocking layer buried in the opening are formed.

6. A method for fabricating the semiconductor device according to claim 1, further comprising the step of:

disconnecting the fuse by a laser ablation.

7. A method for fabricating the semiconductor device according to claim 6, wherein in the step of forming the blocking layer, the blocking layer including a tungsten layer is formed.

8. A method for fabricating the semiconductor device according to claim 3, further comprising the step of:

disconnecting the fuse by a laser ablation.

9. A method for fabricating the semiconductor device according to claim 8, wherein in the step of forming the blocking layer, the blocking layer including a tungsten layer is formed.

10. A method for fabricating the semiconductor device comprising the steps of:

forming on a substrate a first insulation film having a first contact hole formed in a first region, and a first opening formed in a second region formed in;

depositing a first conducting film on the first insulation film and etching back the same to form a first plug buried in the first contact hole and formed of the first conducting film, and a first blocking layer buried in the first opening and formed of the first conducting film;

forming on the first insulation film with the first plug and the first blocking layer formed on a second insulation film having a second contact hole formed in a third region and a second opening formed in the second region;

depositing a second conducting film on the second insulation film and etching back the same to form a second plug buried in the second contact hole and formed of the second conducting film, and a second blocking layer buried in the second opening and formed of the second conducting film;

forming a third insulation film on the second insulation film with the second plug and the second blocking layer formed on; and forming a fuse on the third insulation film in the second region.

11. A method for fabricating the semiconductor device according to claim 10, wherein the second blocking layer is formed in a region where at least the first blocking layer is not formed to constitute by the first blocking layer and the second blocking layer an uninterrupted blocking region as viewed in a plan layout.

12. A method for fabricating the semiconductor device according to claim 10, further comprising the step of:

disconnecting the fuse by a laser ablation.

13. A method for fabricating the semiconductor device according to claim 12, wherein in the step of forming the first conducting film, the first conducting film including a tungsten layer is formed, and in the step of forming the second conducting film, the second conducting film including a tungsten layer is formed.

14. A method for fabricating a semiconductor device comprising the steps of:

forming a first insulation film over a substrate;

forming a metal plug over the first insulation film, the metal plug being a blocking layer for protecting an underlying structure thereof; and forming a fuse over the metal plug.

15. A method for fabricating the semiconductor device according to claim 14, wherein the step of forming the metal plug including the steps of:

forming a second insulation film on the first insulation film;

forming a via-hole in the second insulation film; and filling the metal plug in the via-hole.

16. A method for fabricating the semiconductor device according to claim 14, further comprising the step of disconnecting the fuse by a laser ablation.

17. A method for fabricating the semiconductor device according to claim 16, wherein in the step of forming the metal plug, the metal plug including a tungsten layer is formed.

* * * * *